United States Patent
Phan et al.

(10) Patent No.: US 9,887,245 B2
(45) Date of Patent: Feb. 6, 2018

(54) IMAGE DEVICE WITH IMPROVED CHROMINANCE QUALITY

(71) Applicant: VP ASSETS LIMITED, Road Town (VG)

(72) Inventors: Gia-Chuong Phan, Berlin (DE); Maggie Phan, Vancouver (CA); Anthony Phan, Vancouver (CA); Shi-Ki Dong, Shatin (HK)

(73) Assignee: VP ASSETS LIMITED, Road Town (VG)

( * ) Notice: Subject to any disclaimer, the term of this patent is extended or adjusted under 35 U.S.C. 154(b) by 0 days.

(21) Appl. No.: 15/080,568

(22) Filed: Mar. 24, 2016

(65) Prior Publication Data

US 2016/0284767 A1 Sep. 29, 2016

Related U.S. Application Data

(60) Provisional application No. 62/137,250, filed on Mar. 24, 2015, provisional application No. 62/166,110, filed on May 25, 2015.

(51) Int. Cl.
*H01L 27/32* (2006.01)
*H01L 33/08* (2010.01)
*G09G 3/20* (2006.01)

(52) U.S. Cl.
CPC ....... *H01L 27/3213* (2013.01); *G09G 3/2003* (2013.01); *H01L 27/3218* (2013.01); *H01L 33/08* (2013.01); *G02F 2201/52* (2013.01); *G09G 2300/0452* (2013.01); *G09G 2320/0242* (2013.01); *H01L 27/322* (2013.01)

(58) Field of Classification Search
CPC .............. G09G 3/2003; H01L 27/3213; H01L 27/3218
See application file for complete search history.

(56) References Cited

U.S. PATENT DOCUMENTS

| | | | |
|---|---|---|---|
| 2007/0285540 A1* | 12/2007 | Kwon | H04N 5/332 348/272 |
| 2009/0051638 A1* | 2/2009 | Horiuchi | G09G 3/2003 345/88 |
| 2009/0115952 A1* | 5/2009 | Nakamura | G02B 5/201 349/143 |
| 2012/0062824 A1* | 3/2012 | Lee | G02F 1/133514 349/109 |
| 2014/0204321 A1* | 7/2014 | Koh | G02F 1/133514 349/109 |
| 2016/0055781 A1* | 2/2016 | Phan | G09G 3/2003 345/690 |
| 2016/0055821 A1* | 2/2016 | Phan | G02F 1/133514 345/592 |
| 2016/0284768 A1* | 9/2016 | Phan | H01L 27/3213 |

* cited by examiner

*Primary Examiner* — Allan R Wilson
(74) *Attorney, Agent, or Firm* — ScienBiziP, P.C.

(57) ABSTRACT

An image device includes a plurality of red sub-pixels, a plurality of green sub-pixels, a plurality of blue sub-pixels, a plurality of white sub-pixels, and a plurality of yellow sub-pixels. A ratio of the total number of red sub-pixels to the total number of green sub-pixels to the total number of blue sub-pixels to the total number of white sub-pixels and to the total number of yellow sub-pixels is about 3:3:3:2:1.

17 Claims, 25 Drawing Sheets

IMAGE DEVICE WITH IMPROVED CHROMINANCE QUALITY

FIELD

The present disclosure relates to an image device, more particularly to a system and method to improve the chrominance quality of an image device or a display by the utilization of RGBW pixels and RGBY pixels.

BACKGROUND

Referring to FIG. 1, it shows a conventional RGBW display 10. The conventional RGBW display 10 comprises a plurality of RGBW pixels 11. Each RGBW pixel 11 comprises a green sub-pixel 111, a red sub-pixel 112, a blue sub-pixel 113 and a white sub-pixel 114 arranged in a 2×2 matrix. The conventional RGBW display 10 has the merit of enhanced color space and improved brightness and contrast, compared with traditional RGB display. U.S. Pat. No. 4,892,391, U.S. Pat. No. 5,757,452, U.S. Pat. Nos. 7,286,136, 7,742,205, and U.S. Pat. No. 7,583,279 teach RGBW displays. However, the conventional RGBW display 10 has the deficiency of dark yellow. U.S. Pat. No. 4,800,375, U.S. Pat. No. 7,864,271, and U.S. Pat. No. 8,749,727 teach RGBY displays which claim to have better yellow color. However, RGBY display lacks the merits of RGBW displays. U.S. Pat. No. 7,248,314, U.S. Pat. No. 7,995,019, U.S. Pat. No. 8,248,440, U.S. Pat. No. 8,441,601 and U.S. Pat. No. 8,558,857 teach displays with five color sub-pixels. However five color displays have the deficiency of high cost and low brightness and contrast. U.S. Pat. No. 8,384,653 teaches a method to relief the dark yellow problem by classifying the image signal and then adjusts the backlight luminance according to the classification.

BRIEF DESCRIPTION OF THE DRAWINGS

Implementations of the present technology will now be described, by way of example only, with reference to the attached figures, wherein.

DETAILED DESCRIPTION

Figure 1:
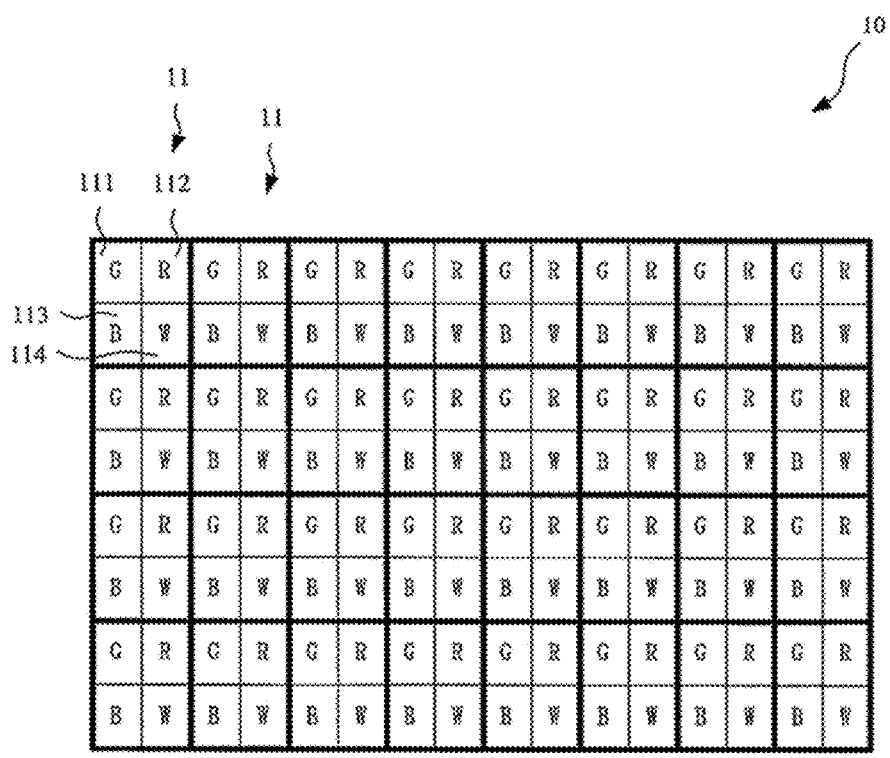
FIG. 1 illustrates a conventional RGBW display.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is relates to an image device with improved chrominance quality. The image device comprises a substrate and a plurality of pixels disposed on the substrate to display an image. The pixels comprise a plurality of sub-pixels. The sub-pixels, e.g., a R sub-pixel representing a red color, a G sub-pixel representing a green color, a B sub-pixel representing a blue color, a W sub-pixel representing a white color, and a Y sub-pixel representing a yellow color, will be described in detail.

Figure 2:
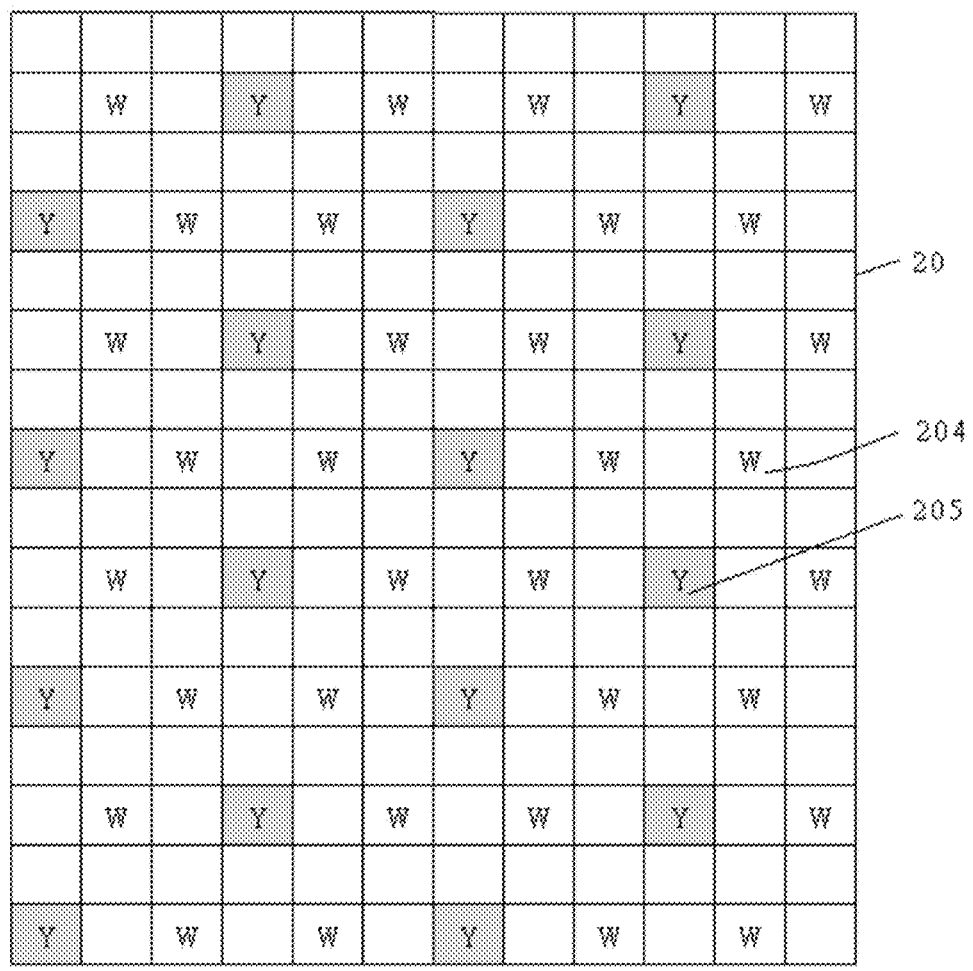
FIG. 2 illustrates an image device according to a first embodiment of the present disclosure.

Referring to FIG. 2, it illustrates an image device 20 according to an embodiment of the present disclosure. The image device 20 comprises a plurality of pixels each comprising a plurality of sub-pixels with different colors arranged in a matrix of rows and columns. As shown in FIG. 2, the image device 20 comprises a plurality of white sub-pixels 204 and a plurality of yellow sub-pixels 205. Every other row comprises white sub-pixels 204 and yellow sub-pixels 205. Namely, in any two adjacent rows, the white sub-pixels 204 and the yellow sub-pixels 205 are arranged in the same row. In this row, white sub-pixels 204 and yellow sub-pixels 205 are separately disposed, and two white sub-pixels 204 are arranged between two yellow sub-pixels 205. Furthermore, the white sub-pixels 204 are arranged in the columns without yellow sub-pixels 205, and the yellow sub-pixels 205 are arranged in the columns without white sub-pixels 204. The white sub-pixels 204 and the yellow sub-pixels 205 arranged in any two adjacent columns are respectively arranged in different rows. The white sub-pixels 204 arranged in any two adjacent columns are respectively arranged in different rows. FIG. 2 shows an arrangement rule of the sub-pixels.

Figure 3:
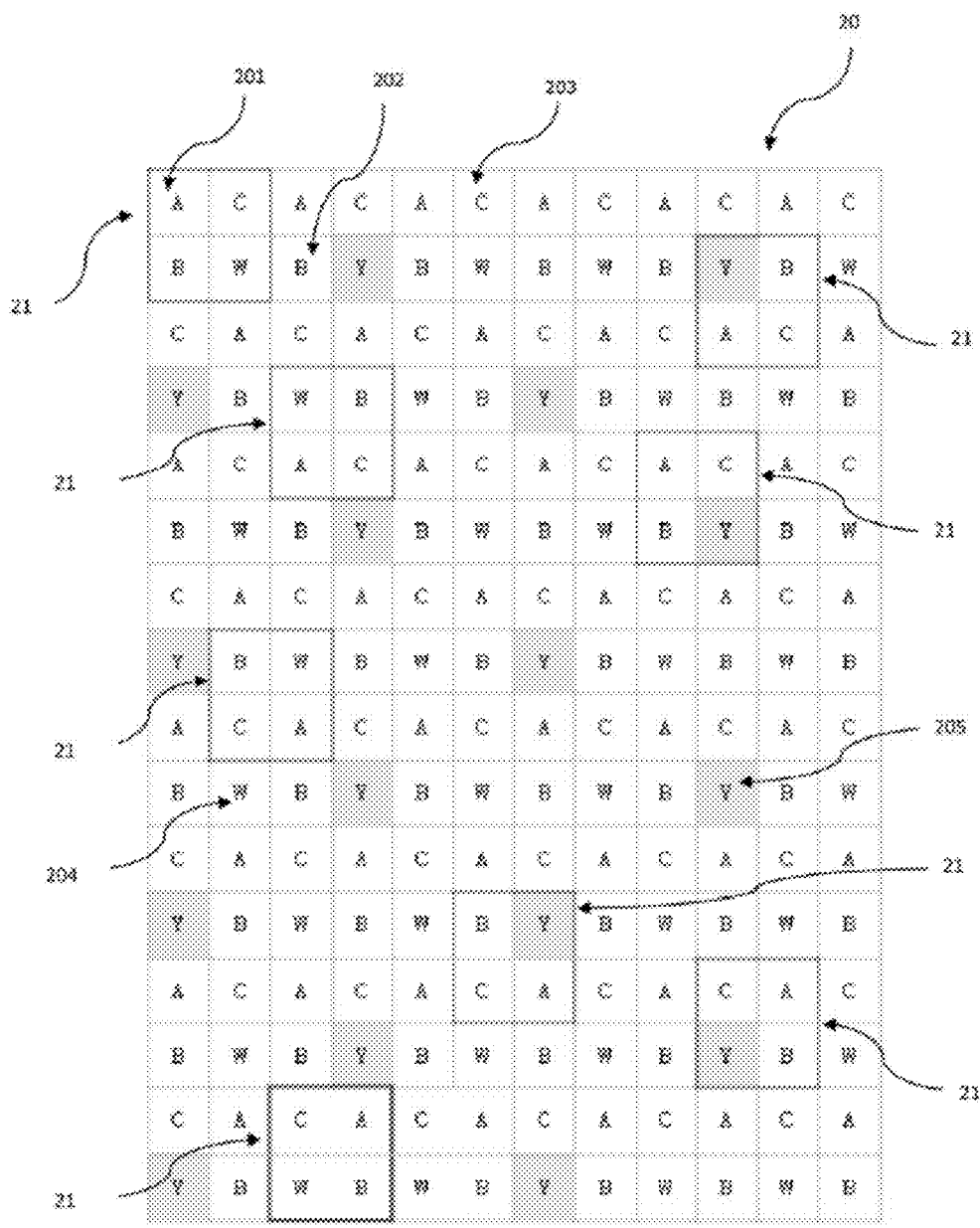
FIG. 3 illustrates an example of the image device of FIG. 2 according to the first embodiment of the present disclosure.

Referring to FIG. 3, it illustrates an example of the image device 20 of FIG. 2 according to the first embodiment of the present disclosure. The image device 20 comprises a plurality of pixels comprising a plurality of sub-pixels with different colors arranged in a matrix of rows and columns. As shown in FIG. 3, the image device 20 comprises a plurality of A sub-pixels 201, a plurality of B sub-pixels 202, a plurality of C sub-pixels 203, a plurality of white sub-pixels 204 and a plurality of yellow sub-pixels 205. In any 2×2 matrix 21, there are always one A sub-pixel 201, one B sub-pixel 202, and one C sub-pixel 203. In other words, the image device 20 may comprise a plurality of ABCW pixels and a plurality of ABCY pixels. Each ABCW pixel comprises a A sub-pixel 201, a B sub-pixel 202, a C sub-pixel 203 and a white sub-pixel 204. Each ABCY pixel comprises a A sub-pixel 201, a B sub-pixel 202, a C sub-pixel 203 and a yellow sub-pixel 205. The ABCW pixels and the ABCY pixels are mixed in the image device 20. The A sub-pixel 201, B sub-pixel 202, and C sub-pixel 203 may respectively be a red sub-pixel, a green sub-pixel, or a blue sub-pixel, as required or designed. Namely, the A sub-pixel 201 may be a red sub-pixel, a green sub-pixel, or a blue sub-pixel, the B sub-pixel 202 may be a red sub-pixel, a green sub-pixel, or a blue sub-pixel, and the C sub-pixel 203 may be a red sub-pixel, a green sub-pixel, or a blue sub-pixel.

Figure 4:
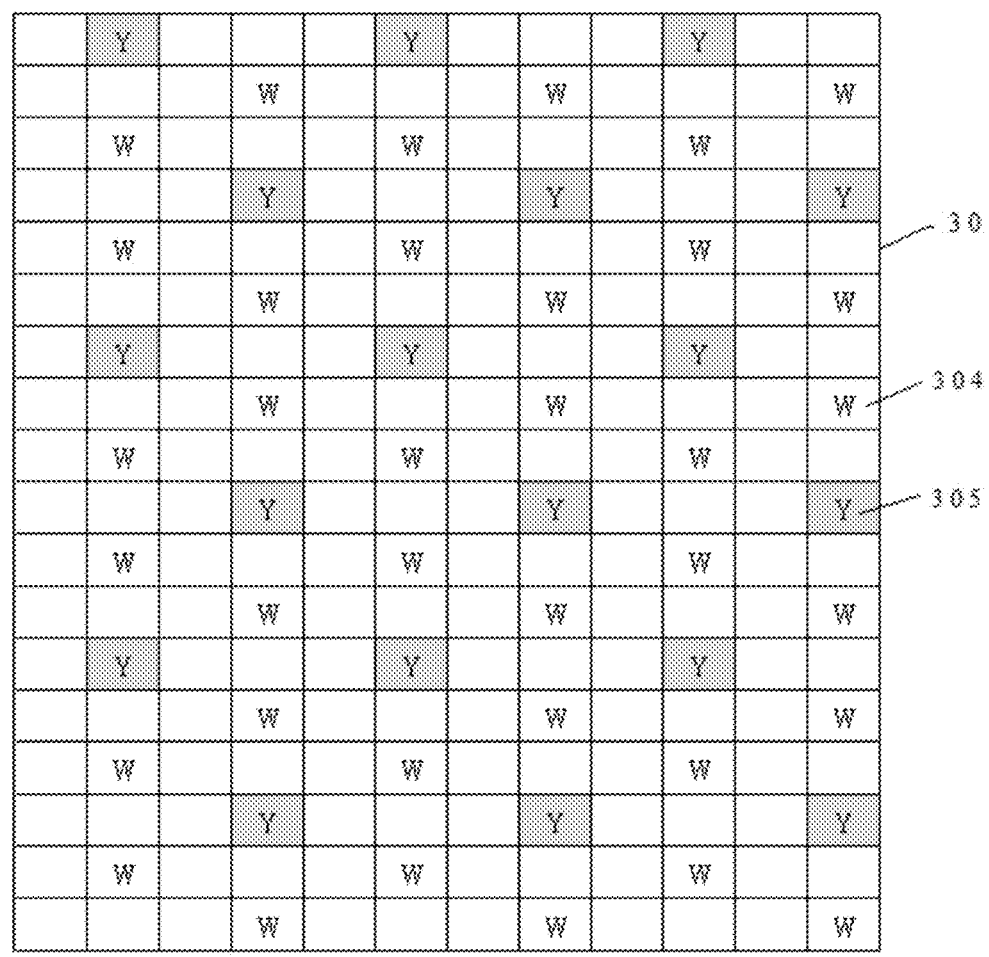
FIG. 4 illustrates another image device according to a second embodiment of the present disclosure.

Referring to FIG. 4, it illustrates an image device according to a second embodiment of the present disclosure. The image device 30 comprises a plurality of pixels comprising a plurality of sub-pixels with different colors arranged in a matrix of rows and columns. As shown in FIG. 4, the image device 30 comprises a plurality of white sub-pixels 304 and a plurality of yellow sub-pixels 305. Every other column comprises white sub-pixels 304 and yellow sub-pixels 305. Namely, in any two adjacent columns, all of the white sub-pixels 304 and the yellow sub-pixels 305 are arranged in the same column. In this column, white sub-pixels 304 and yellow sub-pixels 305 are separately disposed, and two white sub-pixels 304 are arranged between two yellow sub-pixels 305. Furthermore, the white sub-pixels 304 are arranged in the rows without yellow sub-pixels 305, and the yellow sub-pixels 305 are arranged in the rows without white sub-pixels 304. The white sub-pixels 304 and the yellow sub-pixels 305 arranged in any two adjacent rows are respectively arranged in different columns. The white sub-pixels 304 arranged in any two adjacent rows are respectively arranged in different columns. FIG. 4 shows an arrangement rule of the sub-pixels, which is similar to arrangement rule shown in FIG. 2 but rotates 90 degrees.

Figure 5:
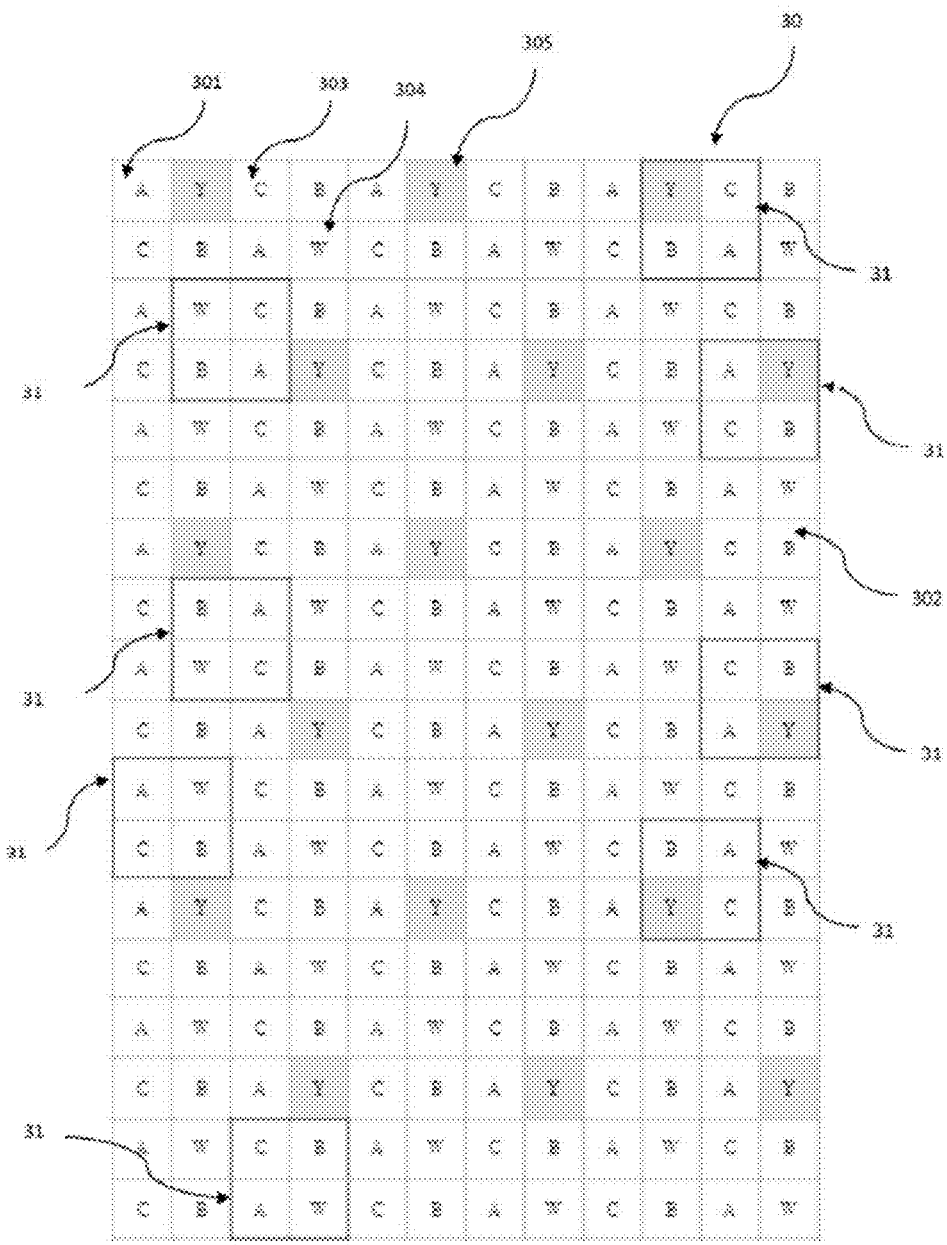
FIG. 5 illustrates an example the image device of FIG. 4 according to the second embodiment of the present disclosure.

Referring to FIG. 5, it illustrates an example of the image device 30 of FIG. 4 according to the second embodiment of the present disclosure. The image device 30 comprises a plurality of pixels comprising a plurality of sub-pixels with different colors arranged in a matrix of rows and columns. As shown in FIG. 5, the image device 30 comprises a plurality of A sub-pixels 301, a plurality of B sub-pixels 302, a plurality of C sub-pixels 303, a plurality of white sub-pixels 304 and a plurality of yellow sub-pixels 305. In any 2×2 matrix 31, there are always one A sub-pixel 301, one B sub-pixel 302, and one C sub-pixel 303. In other words, the image device 30 may comprise a plurality of ABCW pixels and a plurality of ABCY pixels. Each ABCW pixel comprises a A sub-pixel 301, a B sub-pixel 302, a C sub-pixel 303 and a white sub-pixel 304. Each ABCY pixel comprises a A sub-pixel 301, a B sub-pixel 302, a C sub-pixel 303 and a yellow sub-pixel 305. The ABCW pixels and the ABCY pixels are mixed in the image device 30. The A sub-pixel 301, B sub-pixel 302, and C sub-pixel 303 may respectively be a red sub-pixel, a green sub-pixel, or a blue sub-pixel, as required or designed. Namely, the A sub-pixel 301 may be a red sub-pixel, a green sub-pixel, or a blue sub-pixel, the B sub-pixel 302 may be a red sub-pixel, a green sub-pixel, or a blue sub-pixel, and the C sub-pixel 303 may be a red sub-pixel, a green sub-pixel, or a blue sub-pixel.

Figure 6:
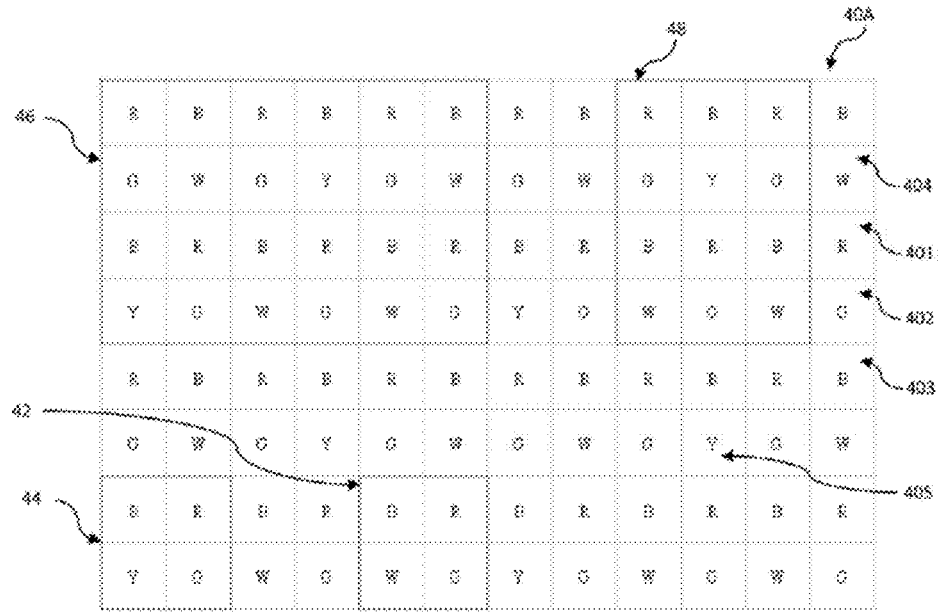
FIGS. 6-21 illustrate several modified examples of the image device according to the first embodiment of the present disclosure.
Figure 7:
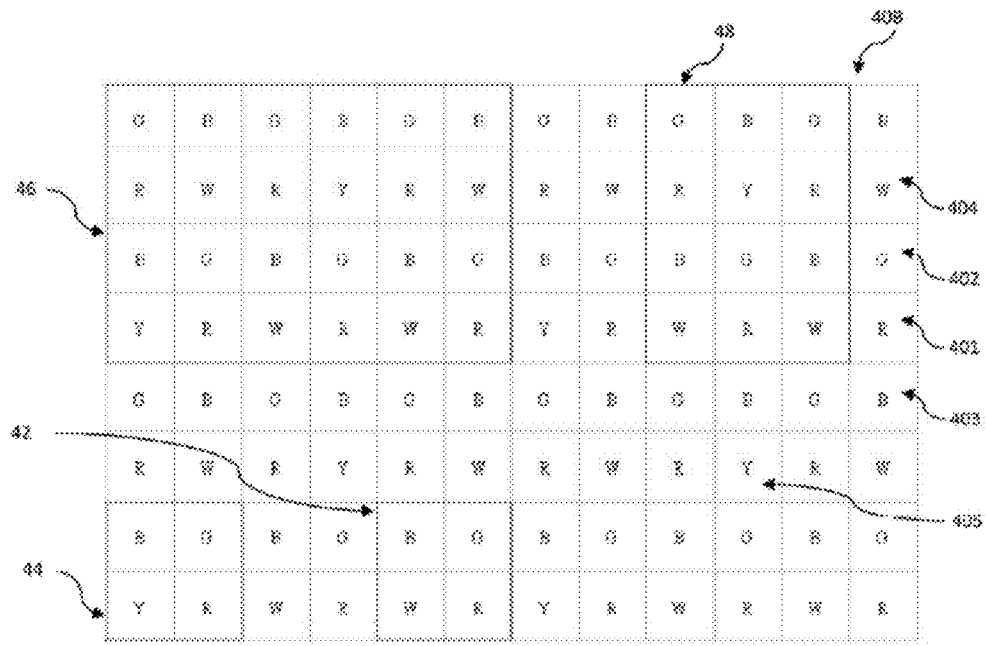
Figure 8:
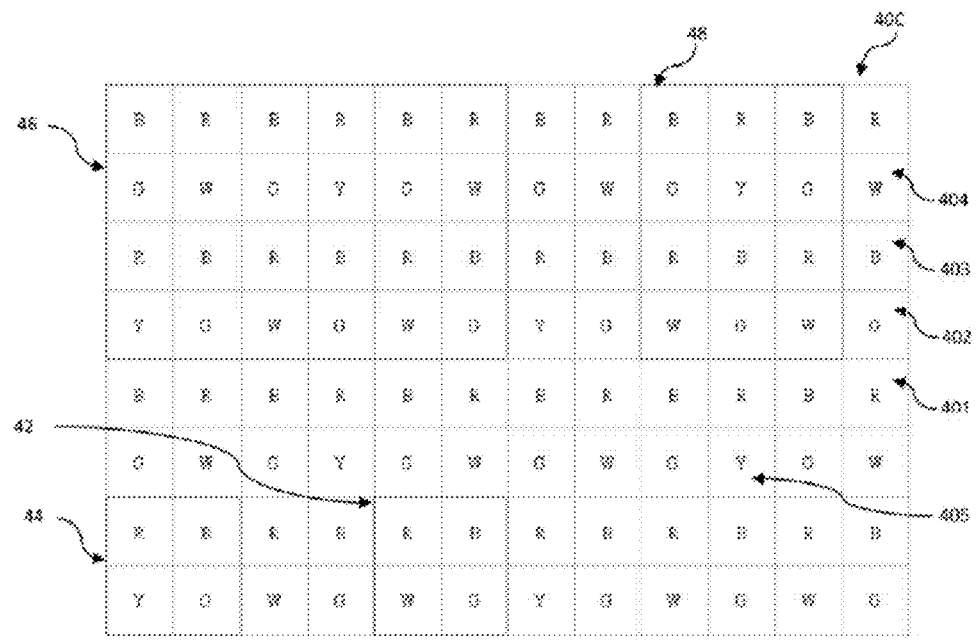
Figure 9:
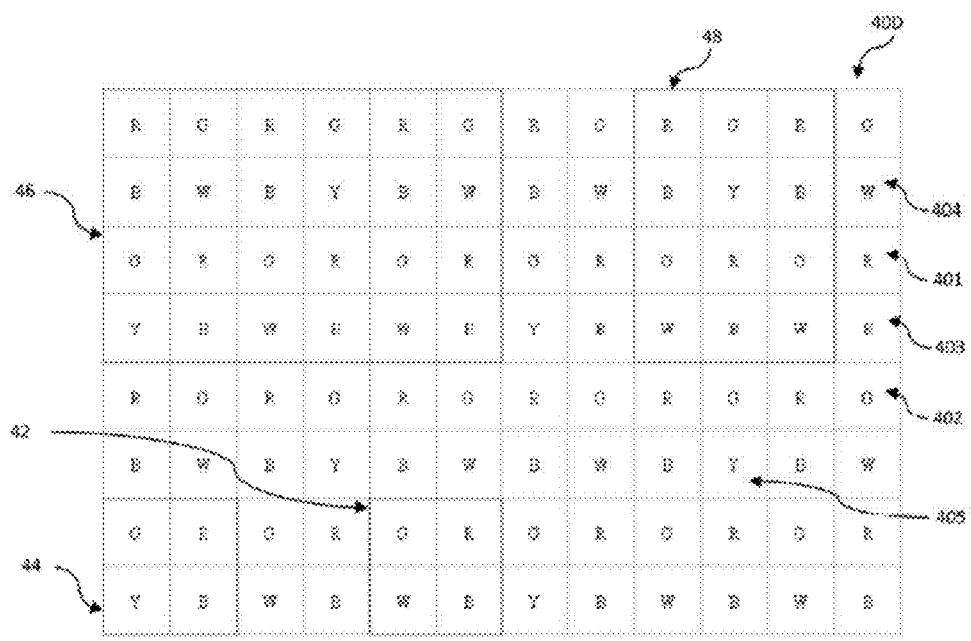
Figure 10:
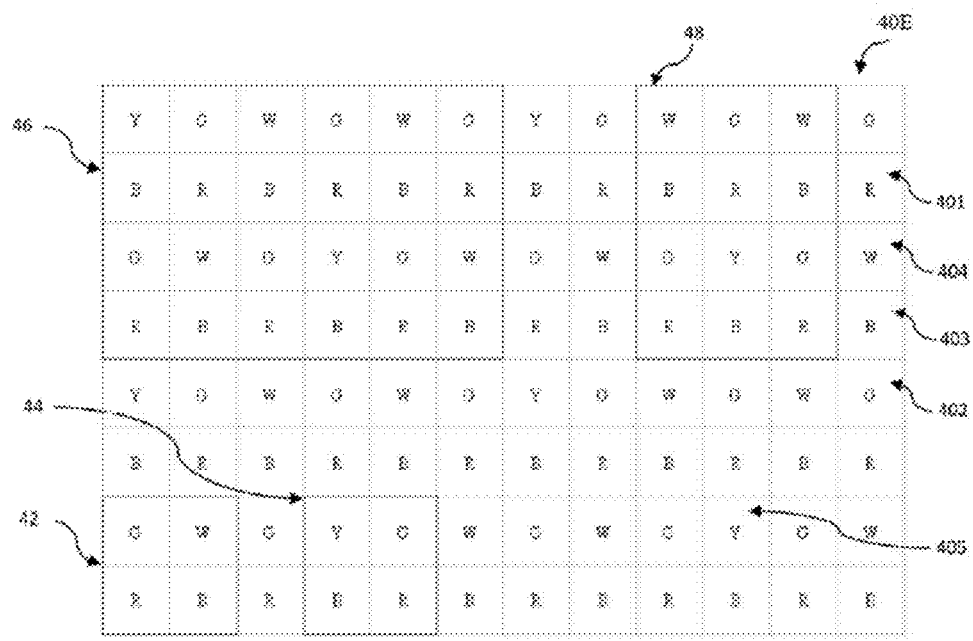
Figure 11:
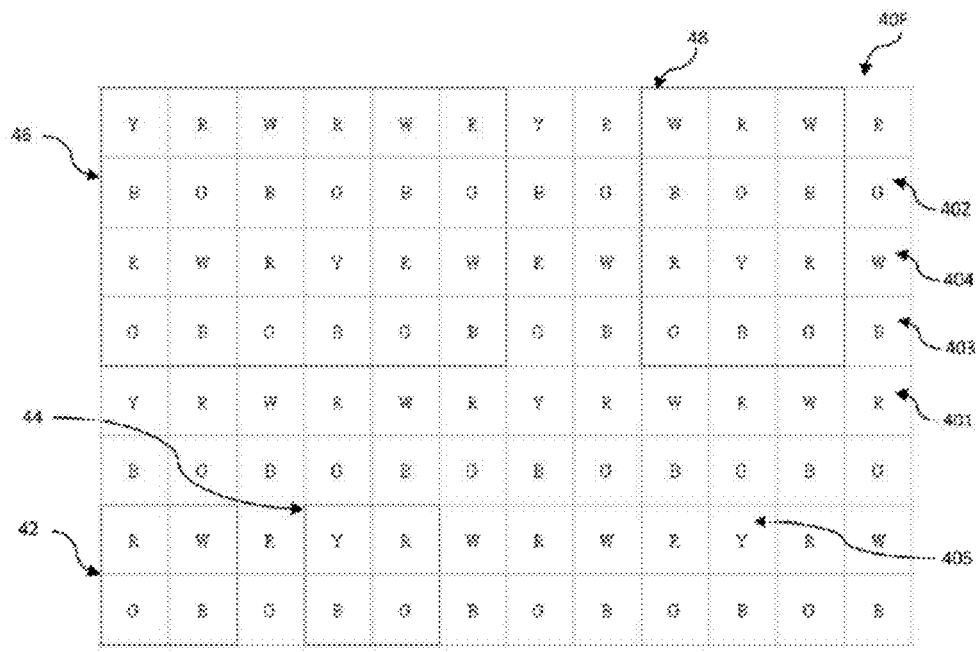
Figure 12:
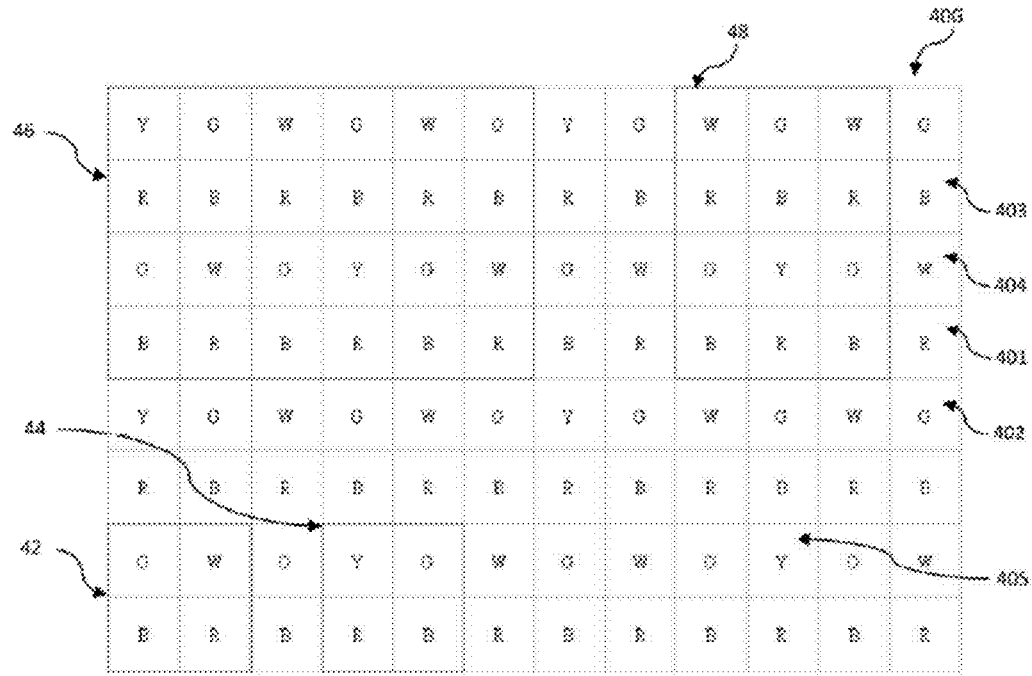
Figure 13:
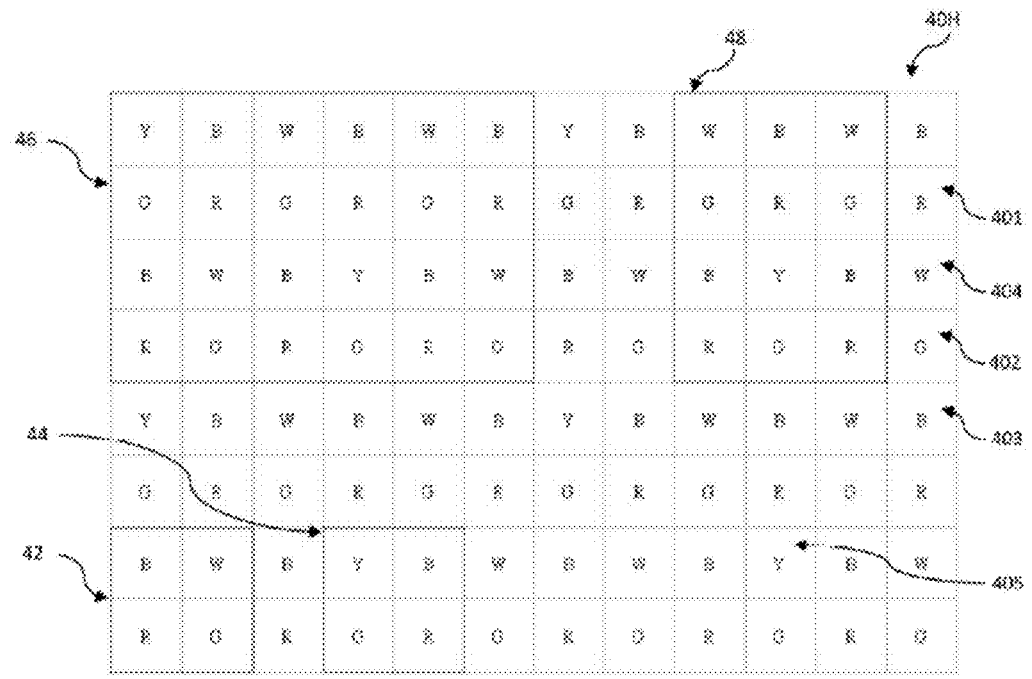
Figure 14:
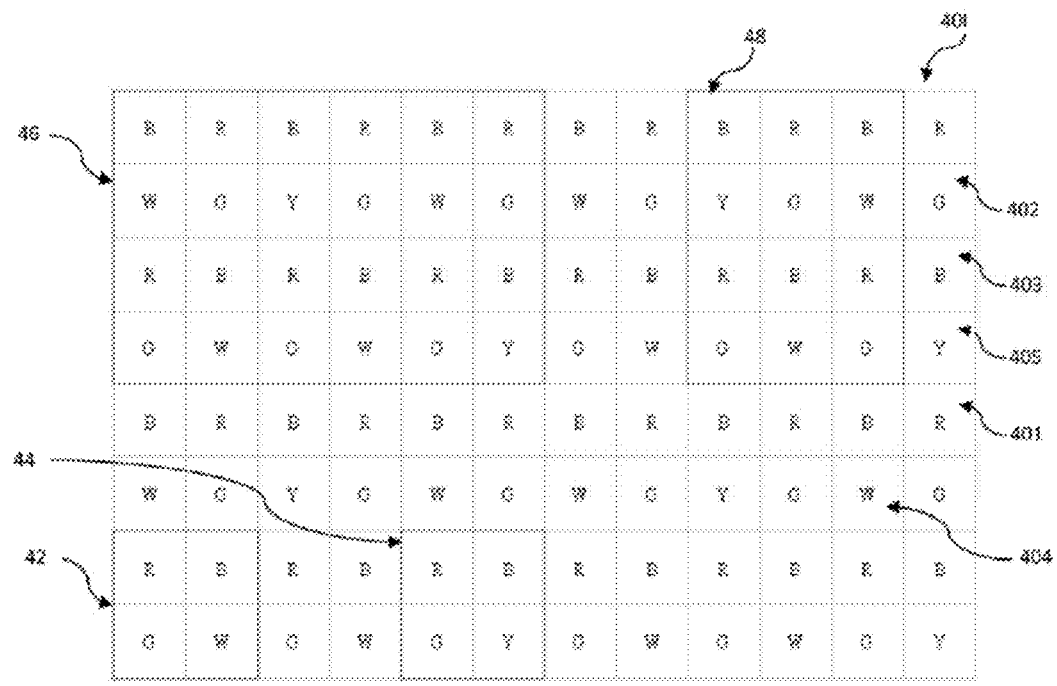
Figure 15:
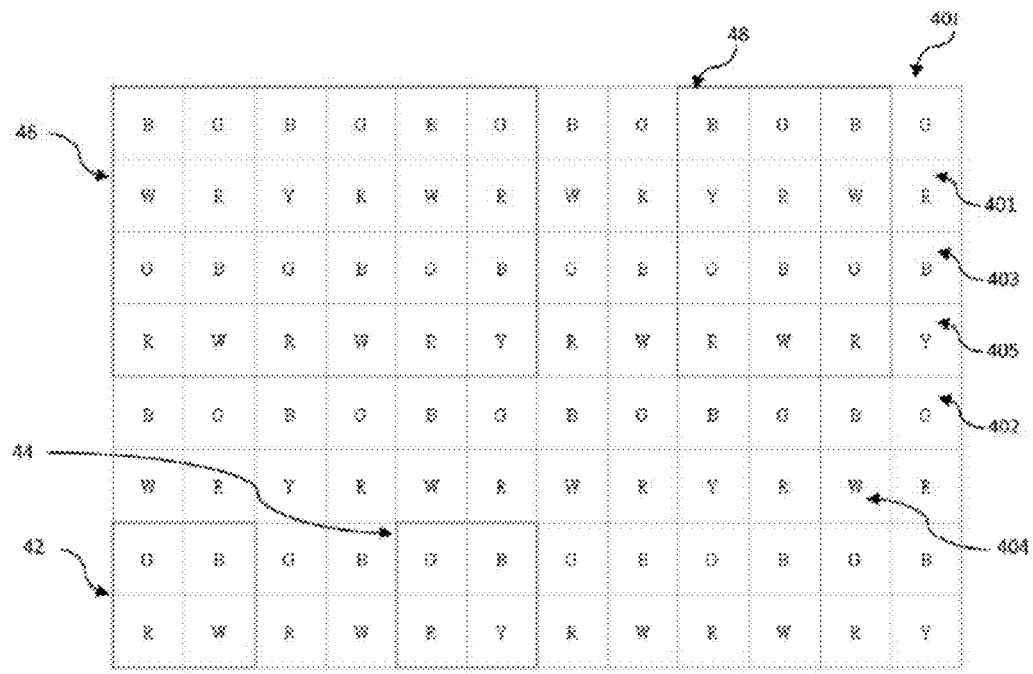
Figure 16:
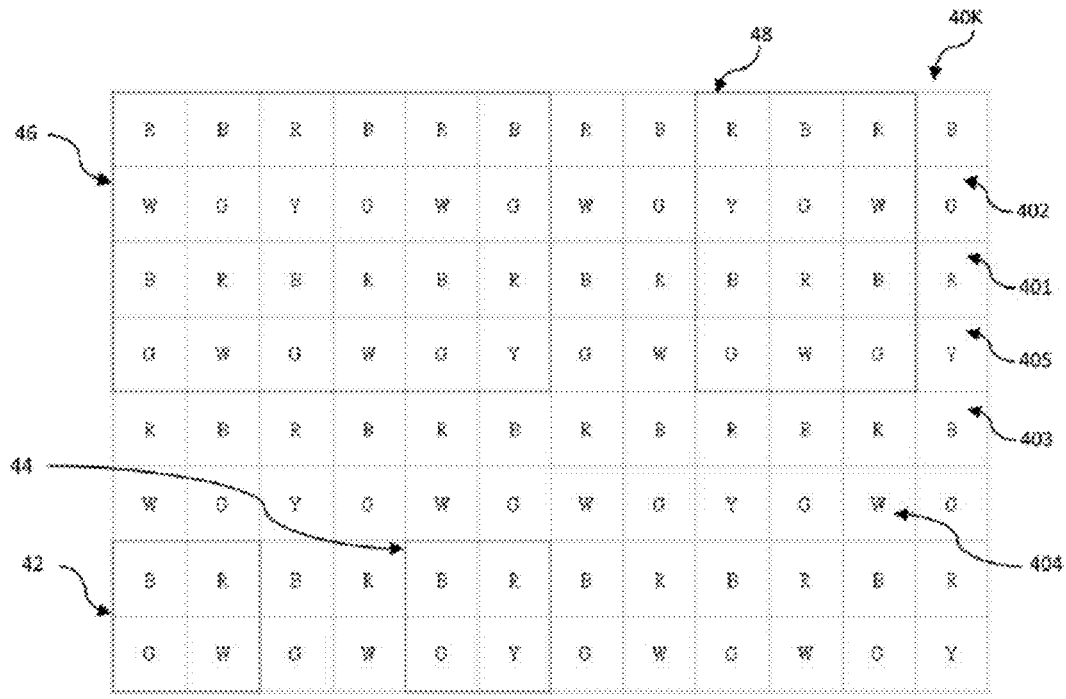
Figure 17:
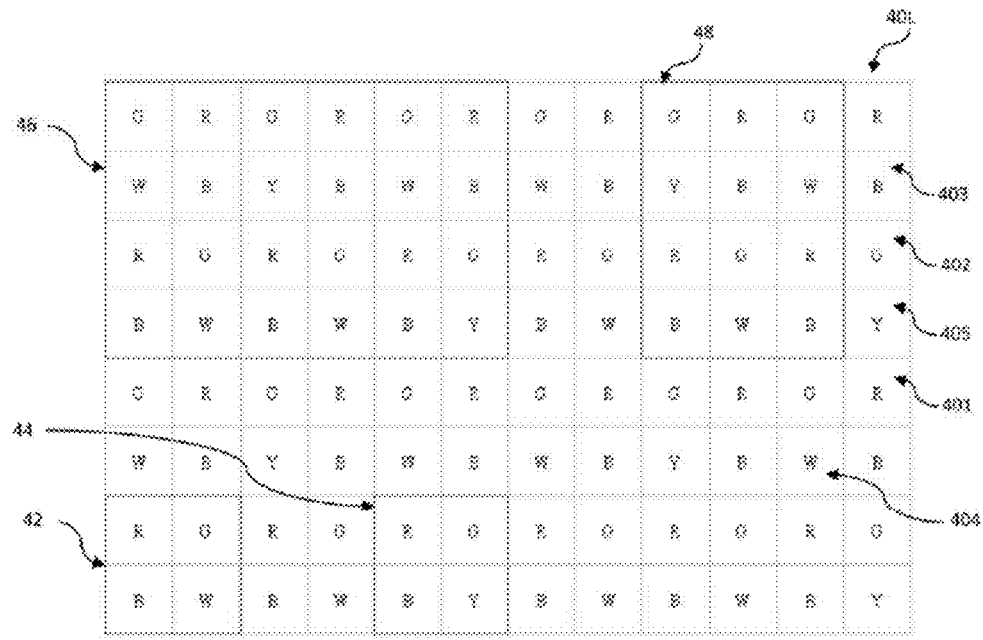
Figure 18:
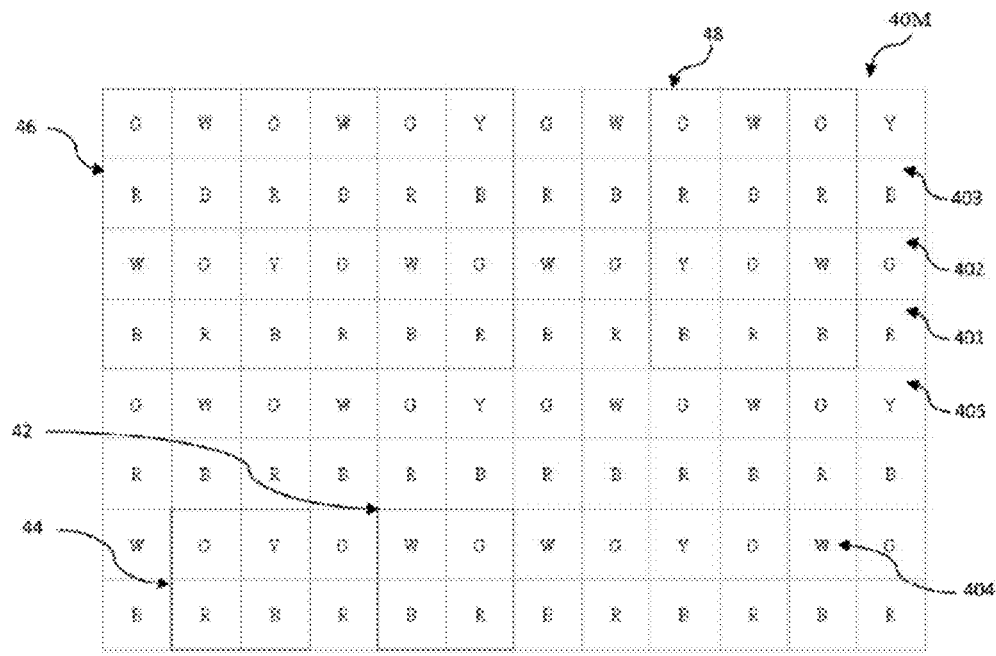
Figure 19:
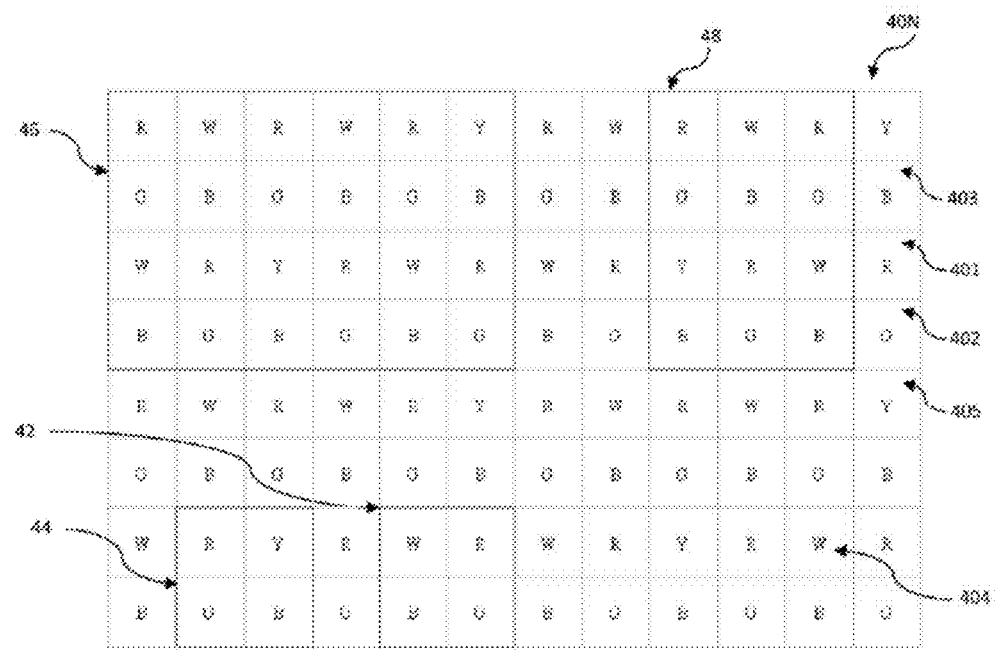
Figure 20:
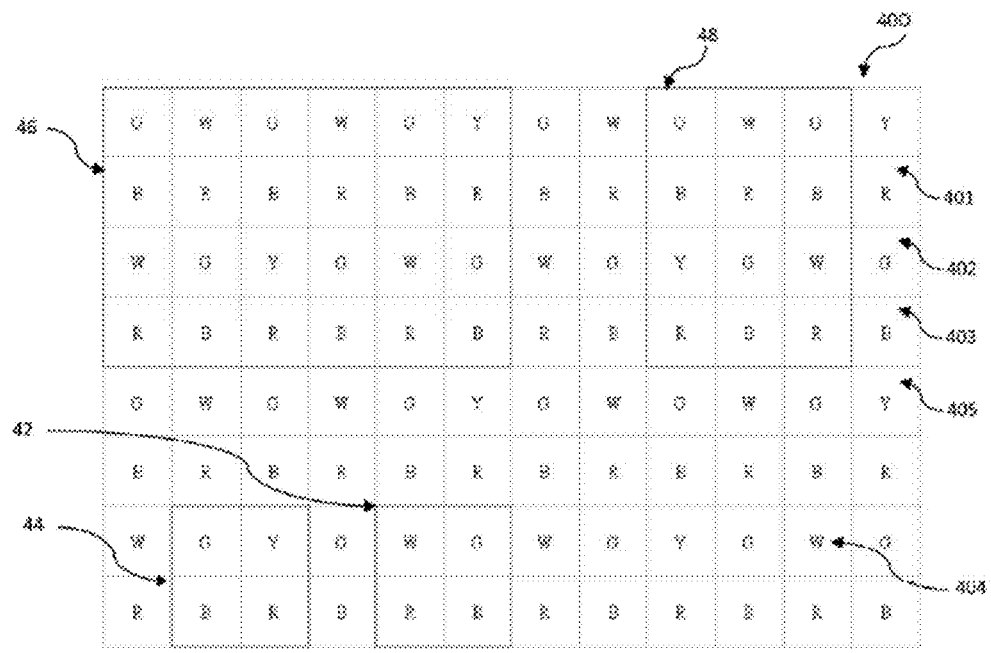
Figure 21:
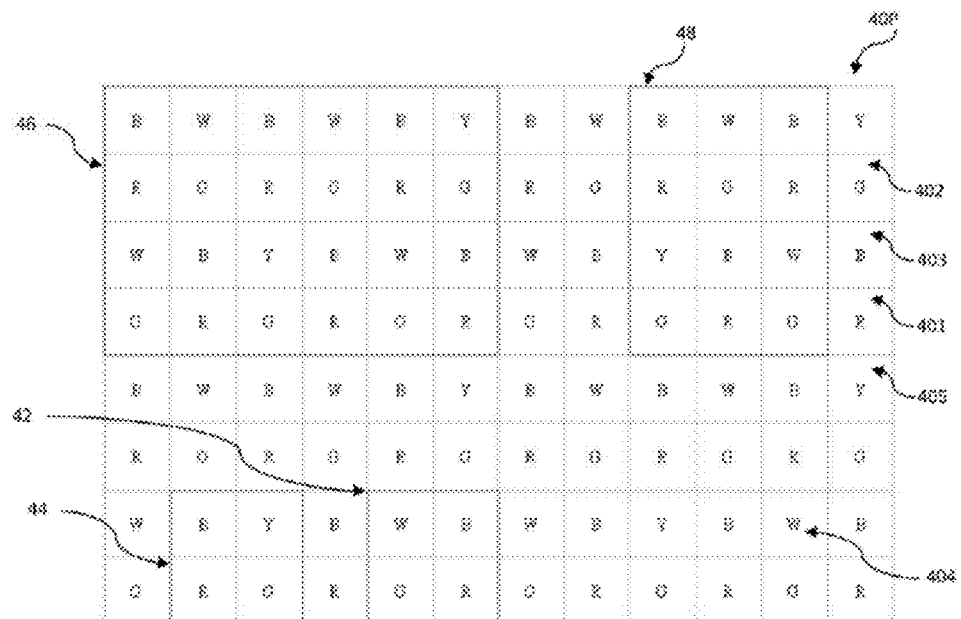
Figure 22:
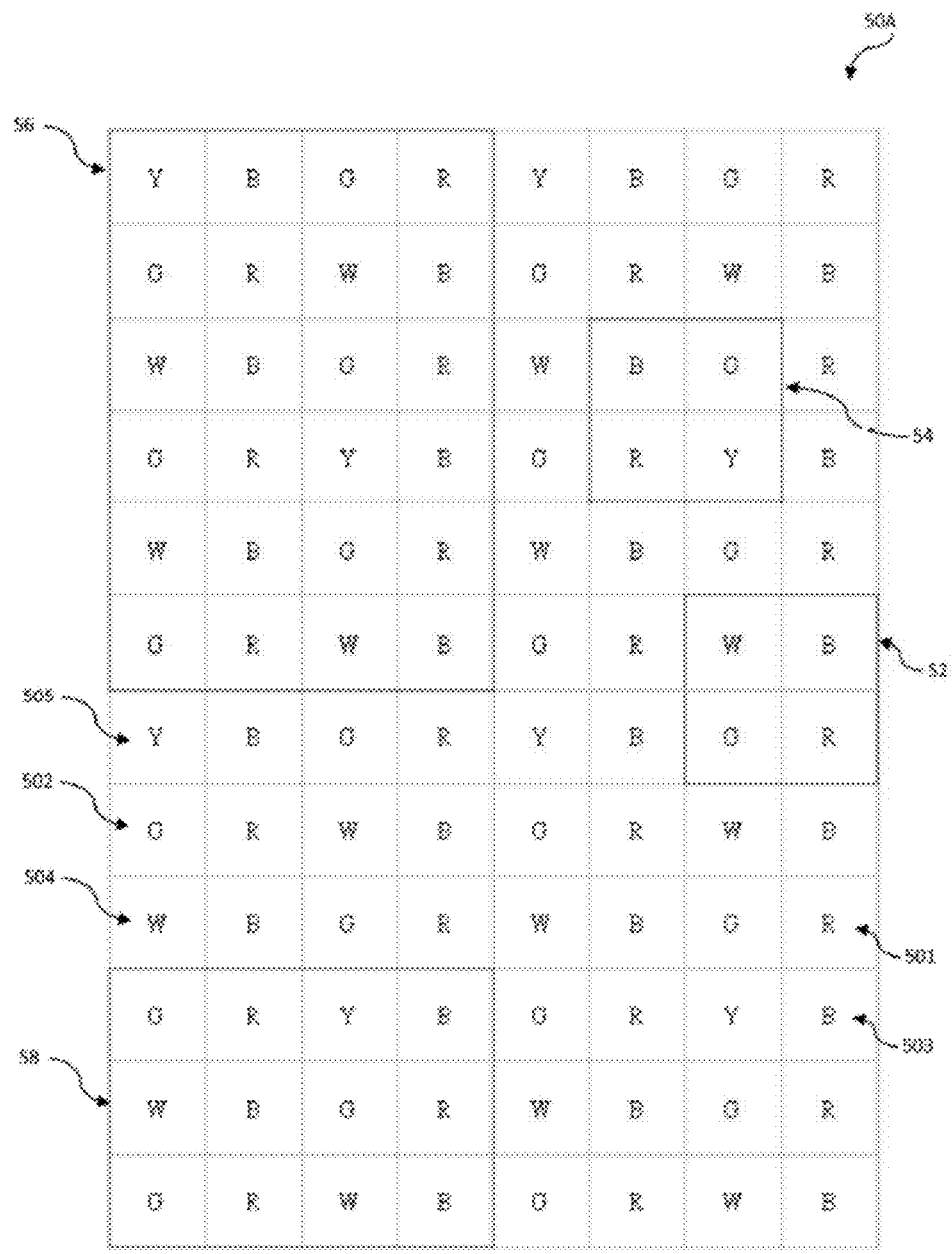
FIGS. 22-25 illustrate several modified examples of the image devices according to the second embodiment of the present disclosure.
Figure 23:
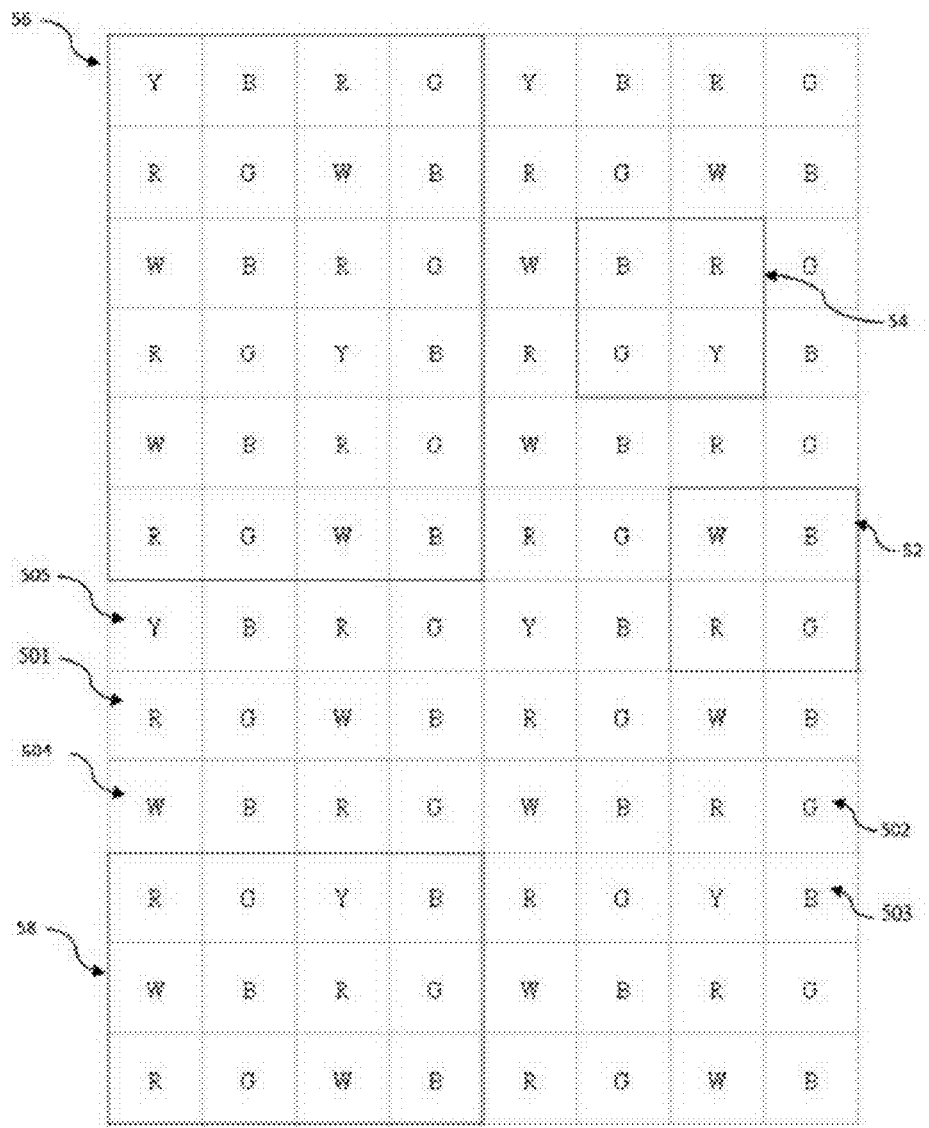
Figure 24:
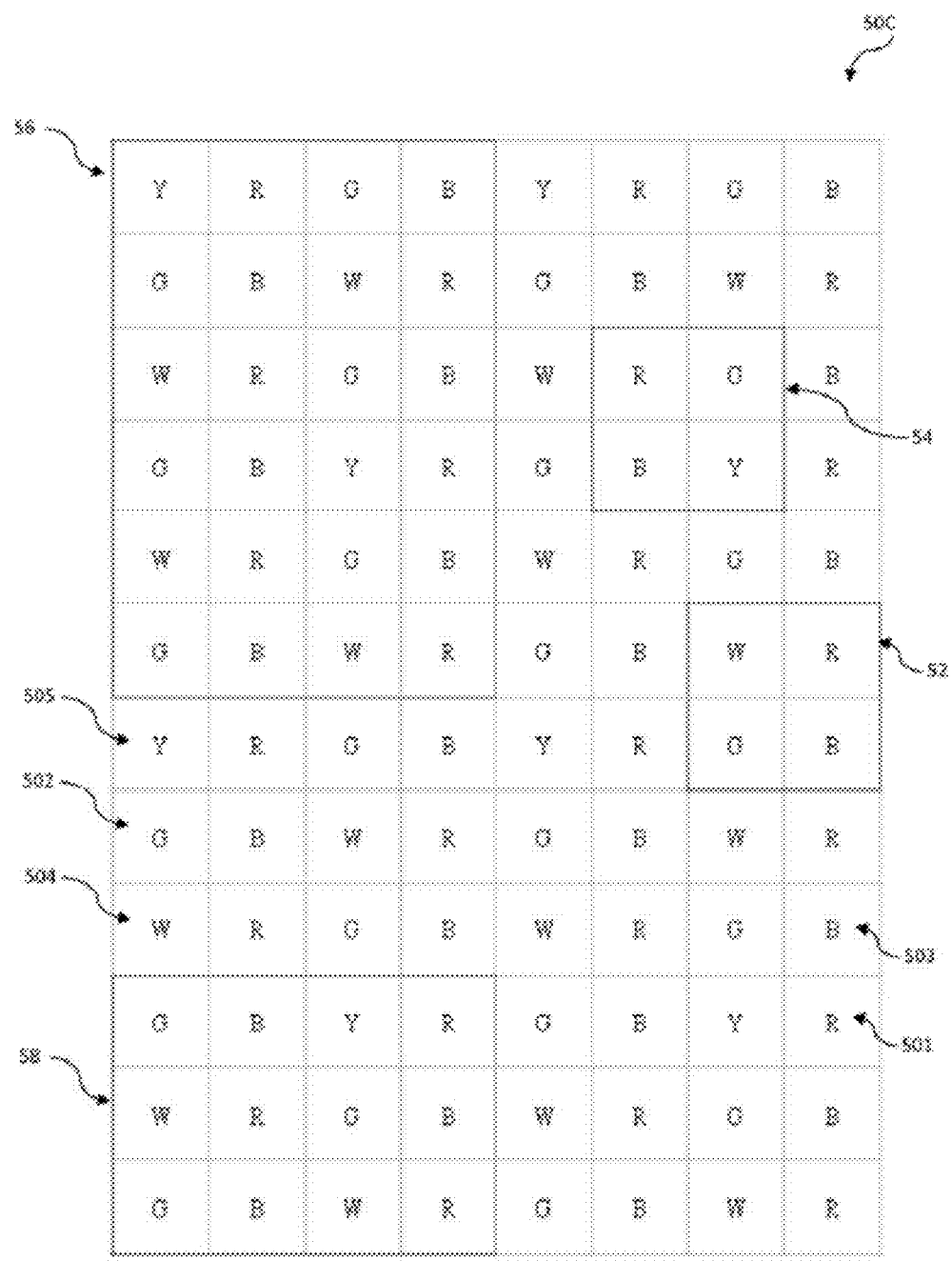
Figure 25:
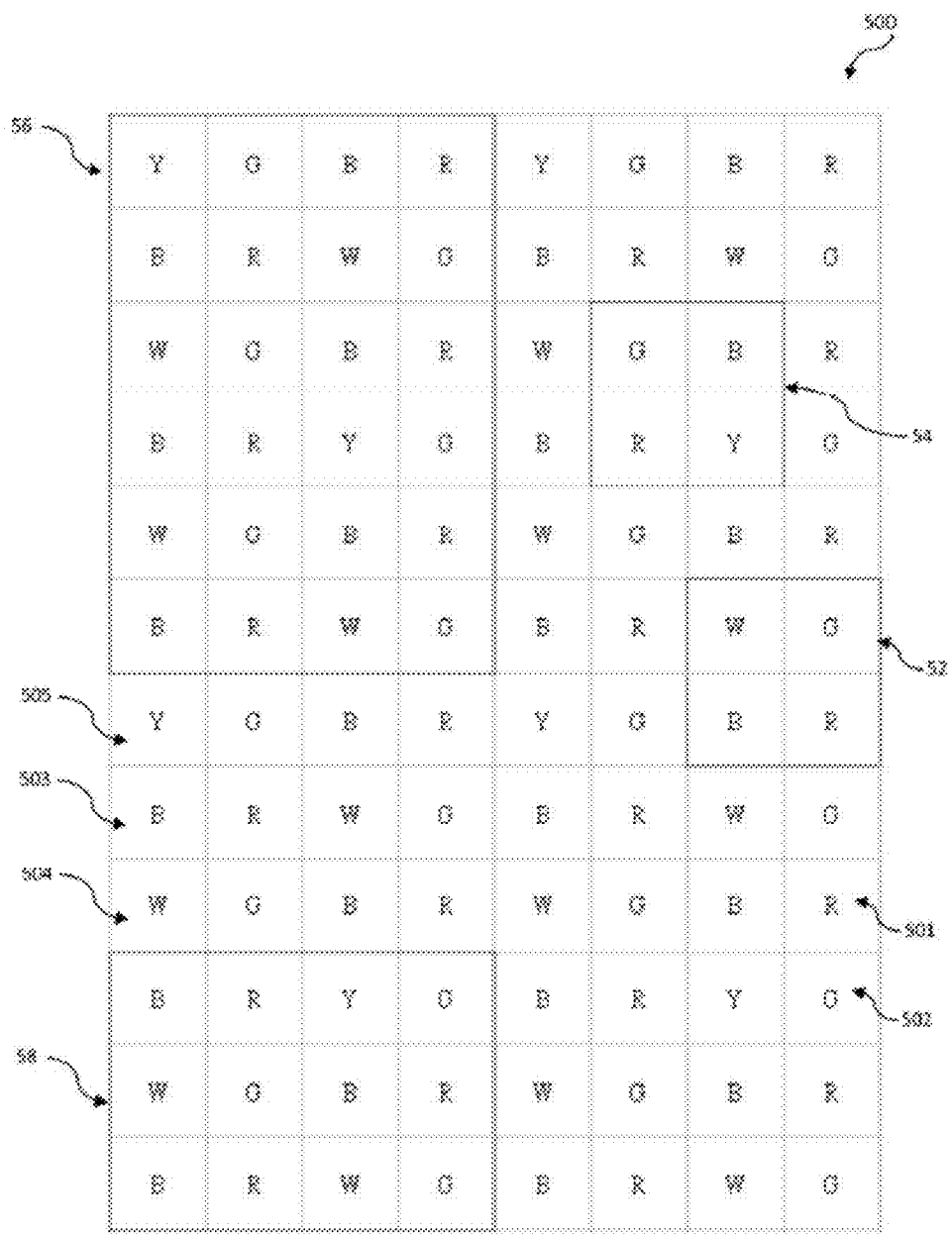

FIG. 6 throughout 21 illustrate several modified examples of image devices 40A-40P following the arrangement rule of the white sub-pixels and yellow sub-pixel described above shown in FIG. 2 according to the first embodiment of the present disclosure. Each of the image devices 40A-40P comprises a plurality of pixels comprising a plurality of sub-pixels with different colors arranged in a matrix of rows and columns. More specifically, each of the image devices 40A-40P comprises a plurality of RGBW pixels 42 and a plurality of RGBY pixels 44. Each RGBW pixels 42 comprises a red sub-pixel 401, a green sub-pixel 402, a blue sub-pixel 403 and a white sub-pixel 404. Each RGBY pixel comprises a red sub-pixel 401, a green sub-pixel 402, a blue sub-pixel 403 and a yellow sub-pixel 405. The RGBW pixels 42 and the RGBY pixels 44 are mixed in the image device 40A-40P.

As shown in FIGS. 6-21, each of the image devices 40A-40P comprises a plurality of white sub-pixels 404 and a plurality of yellow sub-pixels 405. Every other row comprises white sub-pixels 404 and yellow sub-pixels 405. Namely, in any two adjacent rows, the white sub-pixels 404 and the yellow sub-pixels 405 are arranged in the same row. In this row, white sub-pixels 404 and yellow sub-pixels 405 are separately disposed, and two white sub-pixels 404 are arranged between two yellow sub-pixels 405. Furthermore, the white sub-pixels 404 are arranged in the columns without yellow sub-pixels 405, and the yellow sub-pixels 405 are arranged in the columns without white sub-pixels 404. The white sub-pixels 404 and the yellow sub-pixels 405 arranged in any two adjacent columns are respectively arranged in different rows. The white sub-pixels 404 arranged in any two adjacent columns are respectively arranged in different rows.

As shown in FIGS. 6-21, a basic repeating unit 46 is defined. The basic repeating unit 46 is a 4×6 matrix with different color sub-pixels. Repeating the basic repeating unit 46 as much as required to form each of the image devices 40A-40P. In the basic repeating unit 46, a ratio of the number of red sub-pixels 401 to the number of green sub-pixels 402 to the number of blue sub-pixels 403 to the number of white sub-pixels 404 and to the number of yellow sub-pixels 405 is about 3:3:3:2:1. Furthermore, in the basic repeating unit 46, a ratio of the total area of red sub-pixels 401 to the total area of green sub-pixels 402 to the total area of blue sub-pixels 403 to the total area of white sub-pixels 404 and to the total area of yellow sub-pixels 405 is about 3:3:3:2:1.

As shown in FIGS. 6-21, a 4×3 matrix 48 is defined. In the 4×3 matrix 48, a ratio of the number of red sub-pixels 401 to the number of green sub-pixels 402 to the number of blue sub-pixels 403 to the number of white sub-pixels 404 and to the number of yellow sub-pixels 405 is about 3:3:3:2:1. Furthermore, in the 4×3 matrix 48, a ratio of the total area of red sub-pixels 401 to the total area of green sub-pixels 402 to the total area of blue sub-pixels 403 to the total area of white sub-pixels 404 and to the total area of yellow sub-pixels 405 is about 3:3:3:2:1.

More specifically, when chooses any 4×3 matrix in the image devices 40A-40P, a ratio of the number of red sub-pixels 401 to the number of green sub-pixels 402 to the number of blue sub-pixels 403 to the number of white sub-pixels 404 and to the number of yellow sub-pixels 405 is about 3:3:3:2:1. When chooses any 4×3 matrix in the image devices 40A-40P, a ratio of the total area of red sub-pixels 401 to the total area of green sub-pixels 402 to the total area of blue sub-pixels 403 to the total area of white sub-pixels 404 and to the total area of yellow sub-pixels 405 is about 3:3:3:2:1.

FIGS. 22-25 illustrate several modified examples of image devices 50A-50D following the arrangement rule of the white sub-pixels and yellow sub-pixel described above shown in FIG. 4 according to the second embodiment of the present disclosure. Each of the image devices 50A-50D comprises a plurality of pixels comprising a plurality of sub-pixels with different colors arranged in a matrix of rows and columns. More specifically, each of the image devices 50A-50D comprises a plurality of RGBW pixels 52 and a plurality of RGBY pixels 54. Each RGBW pixels 52 comprises a red sub-pixel 501, a green sub-pixel 502, a blue sub-pixel 503 and a white sub-pixel 504. Each RGBY pixel comprises a red sub-pixel 501, a green sub-pixel 502, a blue sub-pixel 503 and a yellow sub-pixel 505. The RGBW pixels 52 and the RGBY pixels 54 are mixed in each of the image devices 50A-50D.

As shown in FIGS. 22-25, each of the image devices 50A-50D comprises a plurality of white sub-pixels 504 and a plurality of yellow sub-pixels 505. Every other column comprises white sub-pixels 504 and yellow sub-pixels 505. Namely, in any two adjacent columns, the white sub-pixels 504 and the yellow sub-pixels 505 are arranged in the same column. In this column, white sub-pixels 504 and yellow sub-pixels 505 are separately disposed, and two white sub-pixels 504 are arranged between two yellow sub-pixels 505. Furthermore, the white sub-pixels 504 are arranged in the rows without yellow sub-pixels 505, and the yellow sub-pixels 505 are arranged in the rows without white sub-pixels 504. The white sub-pixels 504 and the yellow sub-pixels 505 arranged in any two adjacent rows are respectively arranged in different columns. The white sub-pixels 504 arranged in any two adjacent rows are respectively arranged in different columns.

As shown in FIGS. 22-25, a basic repeating unit 56 is defined. The basic repeating unit 56 is a 6×4 matrix with different color sub-pixels. Repeating the basic repeating unit 56 as much as required to form each of the image devices 50A-50D. In the basic repeating unit 56, a ratio of the number of red sub-pixels 501 to the number of green sub-pixels 502 to the number of blue sub-pixels 503 to the number of white sub-pixels 504 and to the number of yellow sub-pixels 505 is about 3:3:3:2:1. Furthermore, in the basic repeating unit 56, a ratio of the total area of red sub-pixels 501 to the total area of green sub-pixels 502 to the total area of blue sub-pixels 503 to the total area of white sub-pixels 504 and to the total area of yellow sub-pixels 505 is about 3:3:3:2:1.

As shown in FIGS. 22-25, a 3×4 matrix 58 is defined. In the 3×4 matrix 58, a ratio of the number of red sub-pixels 501 to the number of green sub-pixels 502 to the number of blue sub-pixels 503 to the number of white sub-pixels 504 and to the number of yellow sub-pixels 505 is about 3:3:3:2:1. Furthermore, in the 3×4 matrix 58, a ratio of the total area of red sub-pixels 501 to the total area of green sub-pixels 502 to the total area of blue sub-pixels 503 to the total area of white sub-pixels 504 and to the total area of yellow sub-pixels 505 is about 3:3:3:2:1.

More specifically, when chooses any 3×4 matrix 58 in the image devices 50A-50D, a ratio of the number of red sub-pixels 501 to the number of green sub-pixels 502 to the number of blue sub-pixels 503 to the number of white sub-pixels 504 and to the number of yellow sub-pixels 505 is about 3:3:3:2:1. When chooses any 3×4 matrix 58 in the image devices 50A-50D, a ratio of the total area of red sub-pixels 501 to the total area of green sub-pixels 502 to the total area of blue sub-pixels 503 to the total area of white sub-pixels 504 and to the total area of yellow sub-pixels 505 is about 3:3:3:2:1.

Figure 26:
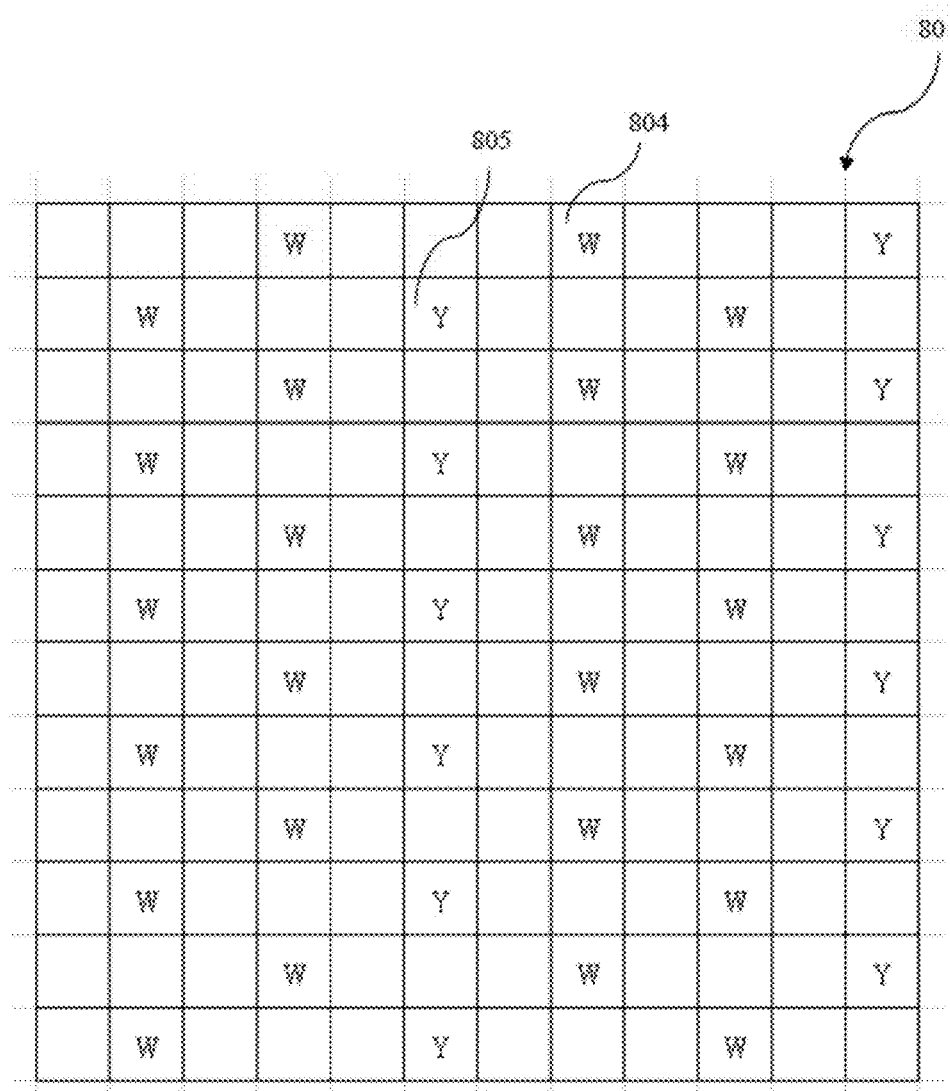
FIG. 26 illustrates an image device according to a third embodiment of the present disclosure.

FIG. 26 illustrates an image device 80 according to a third embodiment of the present disclosure. The image device 80 comprises a plurality of pixels comprising a plurality of sub-pixels with different colors arranged in a matrix of rows and columns. As shown in FIG. 26, the image device 80 comprises a plurality of W sub-pixels 804 and a plurality of Y sub-pixels 805. Every other column comprises W sub-pixels 804 or Y sub-pixels 805. Namely, in any two adjacent columns, the W sub-pixels 804 are arranged in the same column, or the Y sub-pixels 805 are arranged in the same column. The W sub-pixels 804 in the same column are separately disposed. The Y sub-pixels 805 in the same column are separately disposed. Furthermore, the W sub-pixels 804 and the Y sub-pixels 805 arranged in any two nearby columns, which are separated by one column without W sub-pixels 804 or the Y sub-pixels 805, are respectively arranged in different rows. The W sub-pixels 804 arranged in any two nearby columns, which are separated by one column without W sub-pixels 804 or the Y sub-pixels 805, are respectively arranged in different rows.

Figure 27:
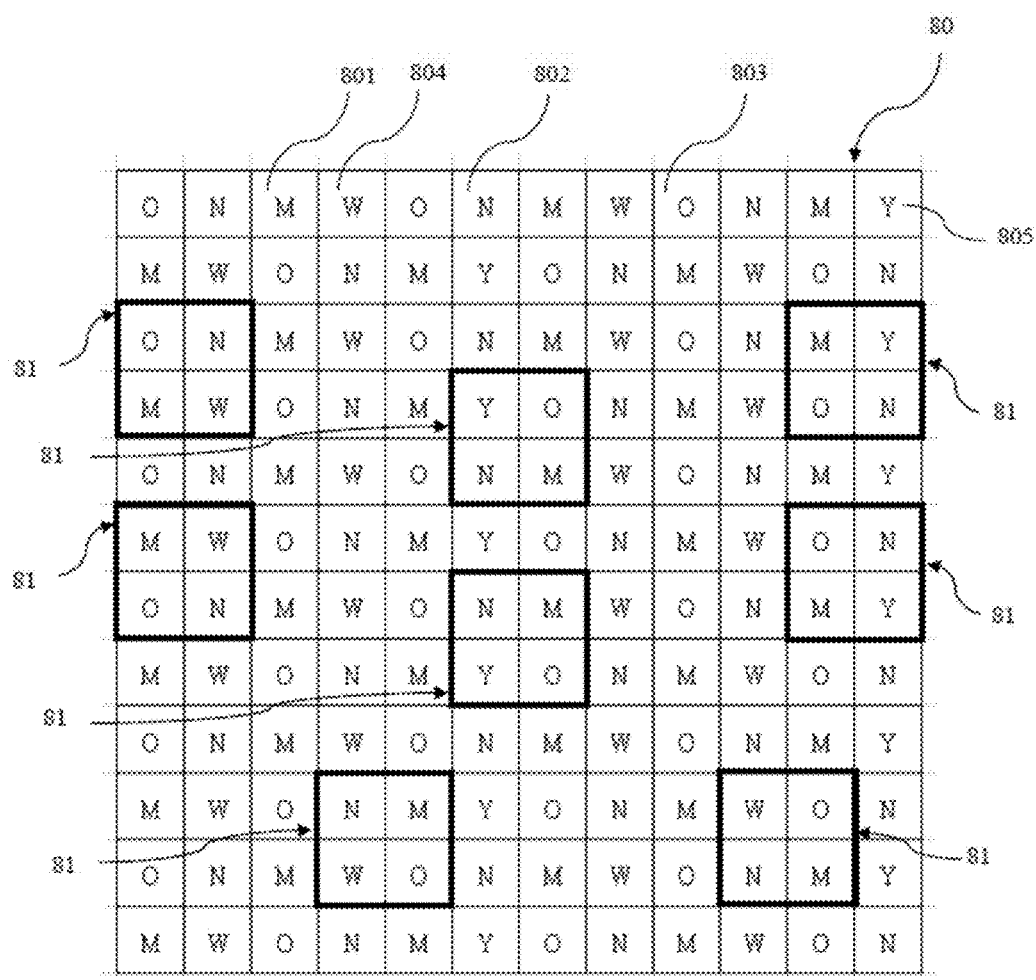
FIG. 27 illustrates an example of the image device of FIG. 26 according to the third embodiment of the present disclosure.
Figure 28:
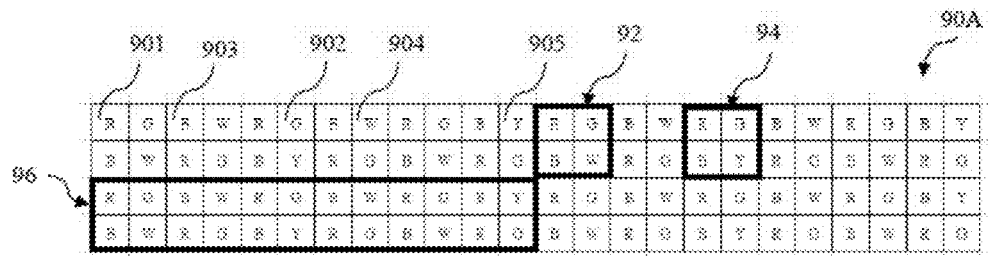
FIGS. 28-33 illustrate several modified examples of the image devices according to the third embodiment of the present disclosure.
Figure 29:
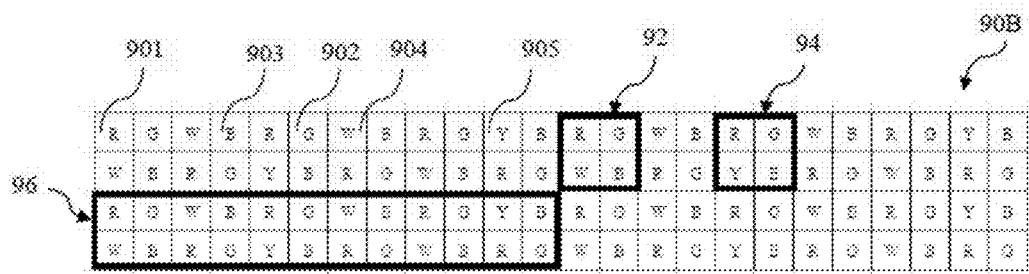
Figure 30:
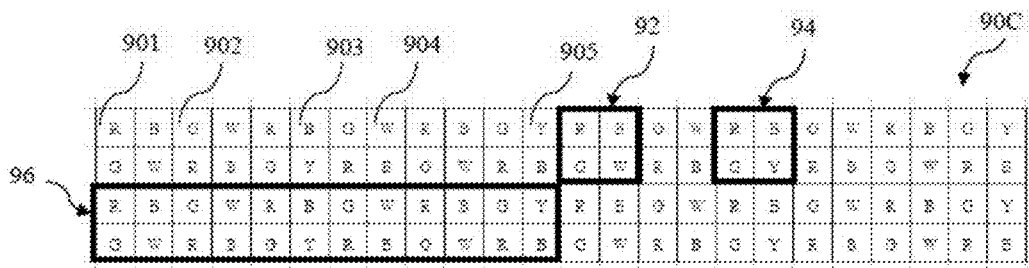
Figure 31:
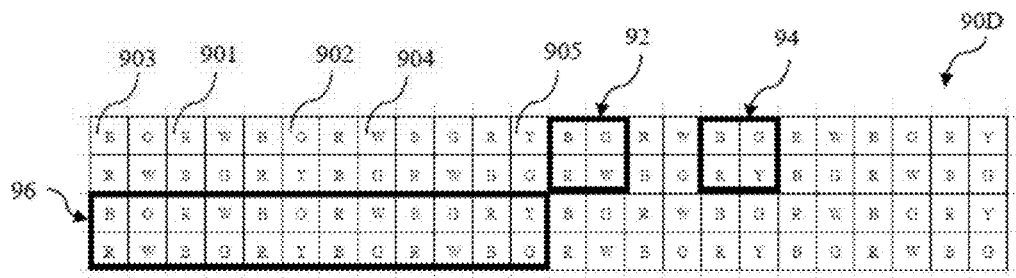
Figure 32:
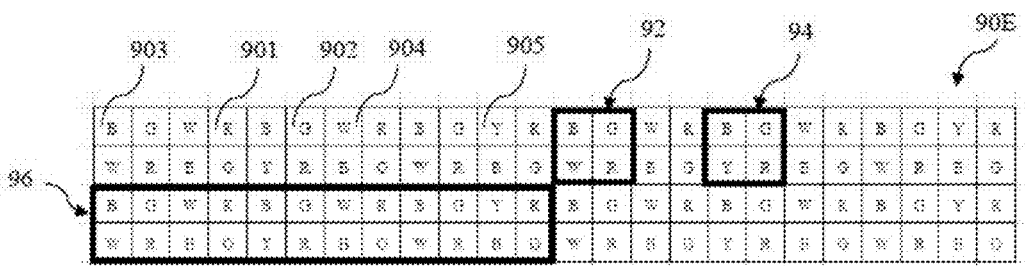
Figure 33:
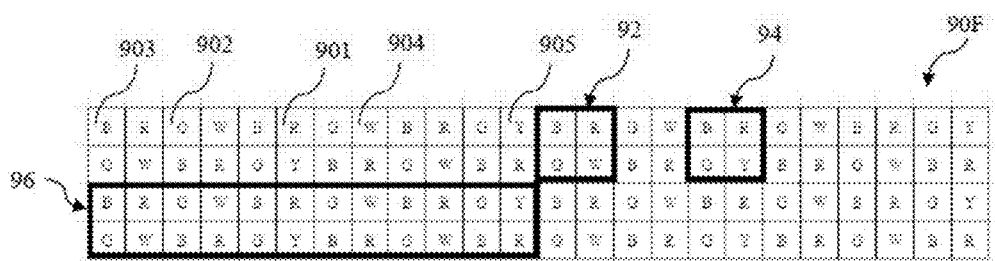

FIG. 27 illustrates an example of the image device 80 of FIG. 26 according to an embodiment of the present disclosure. The image device 80 comprises a plurality of pixels comprising a plurality of sub-pixels with different colors arranged in a matrix of rows and columns. As shown in FIG. 27, the image device 80 comprises a plurality of M sub-pixels 801, a plurality of N sub-pixels 802, a plurality of O sub-pixels 803, a plurality of W sub-pixels 804 and a plurality of Y sub-pixels 805. In any 2×2 matrix 81, there are always one M sub-pixel 801, one N sub-pixel 802, and one O sub-pixel 803. In other words, the image device 80 may comprise a plurality of MNOW pixels and a plurality of MNOY pixels. Each MNOW pixel comprises a M sub-pixel 801, a N sub-pixel 802, an O sub-pixel 803 and a W sub-pixel 804. Each MNOY pixel comprises a M sub-pixel 801, a N sub-pixel 802, an O sub-pixel 803 and a Y sub-pixel 805. The MNOW pixels and the MNOY pixels are mixed in the image device 80.

The M sub-pixel 801, the N sub-pixel 802, and the O sub-pixel 803 may respectively be a R sub-pixel, a G sub-pixel, or a B sub-pixel, as required or designed. Namely, the M sub-pixel 801 may be a R sub-pixel, a G sub-pixel, or a B sub-pixel, the N sub-pixel 802 may be a R sub-pixel, a G sub-pixel, or a B sub-pixel, and the O sub-pixel 803 may be a R sub-pixel, a G sub-pixel, or a B sub-pixel.

Furthermore, in the image device 80, a ratio of the number of M sub-pixels 801 to the number of N sub-pixels 802 to the number of O sub-pixels 803 to the number of W sub-pixels 804 and to the number of Y sub-pixels 805 is m:n:o:w:y. The m is substantially equal to the n. The m is substantially equal to the o. The m is larger than w. The m is larger than y. Sum of the w and the y is substantially equal to the m.

FIGS. 28-33 illustrate several modified examples of image devices 90A-90F following the arrangement rule of the W sub-pixels and Y sub-pixel described above shown in FIG. 26 according to the third embodiment of the present disclosure. Each of the image devices 90A-90F comprises a plurality of pixels comprising a plurality of sub-pixels with different colors arranged in a matrix of rows and columns. More specifically, each of the image devices 90A-90F comprises a plurality of RGBW pixels 92 and a plurality of RGBY pixels 94. Each RGBW pixels 92 comprises a R sub-pixel 901, a G sub-pixel 902, a B sub-pixel 903 and a W sub-pixel 904. Each RGBY pixel 94 comprises a R sub-pixel 901, a G sub-pixel 902, a B sub-pixel 903 and a Y sub-pixel 905. The RGBW pixels 92 and the RGBY pixels 94 are mixed in the image device 90A-90F.

As shown in FIGS. 28-33, each of the image devices 90A-90F comprises a plurality of W sub-pixels 904 and a plurality of Y sub-pixels 905. Every other column comprises W sub-pixels 904 or Y sub-pixels 905. Namely, in any two adjacent columns, the W sub-pixels 904 are arranged in the same column, or the Y sub-pixels 905 are arranged in the same column. The W sub-pixels 904 arranged in the same column are separately disposed. The Y sub-pixels 905 arranged in the same column are separately disposed. Furthermore, the W sub-pixels 904 and the Y sub-pixels 905 arranged in any two nearby columns, which are separated by one column without W sub-pixels 904 or the Y sub-pixels 905, are respectively arranged in different rows. The W sub-pixels 904 arranged in any two nearby columns, which are separated by one column without W sub-pixels 904 or the Y sub-pixels 905, are respectively arranged in different rows.

As shown in FIGS. 28-33, a basic repeating unit 96 is defined. The basic repeating unit 96 is a 2×12 matrix with different color sub-pixels. Repeating the basic repeating unit 96 as much as required to form each of the image devices 90A-90F. In the basic repeating unit 96, a ratio of the number of R sub-pixels 901 to the number of G sub-pixels 902 to the number of B sub-pixels 903 to the number of W sub-pixels 904 and to the number of Y sub-pixels 905 is m:n:o:w:y. The m is substantially equal to the n. The m is substantially equal to the o. The m is larger than w. The m is larger than y. Sum of the w and the y is substantially equal to the m.

In this embodiment, a ratio of the number of R sub-pixels 901 to the number of G sub-pixels 902 to the number of B sub-pixels 903 to the number of W sub-pixels 904 and to the number of Y sub-pixels 905 is about 3:3:3:2:1. Furthermore, in the basic repeating unit 96, a ratio of the total area of R sub-pixels 901 to the total area of G sub-pixels 902 to the total area of B sub-pixels 903 to the total area of W sub-pixels 904 and to the total area of Y sub-pixels 905 is about 3:3:3:2:1.

Figure 34:
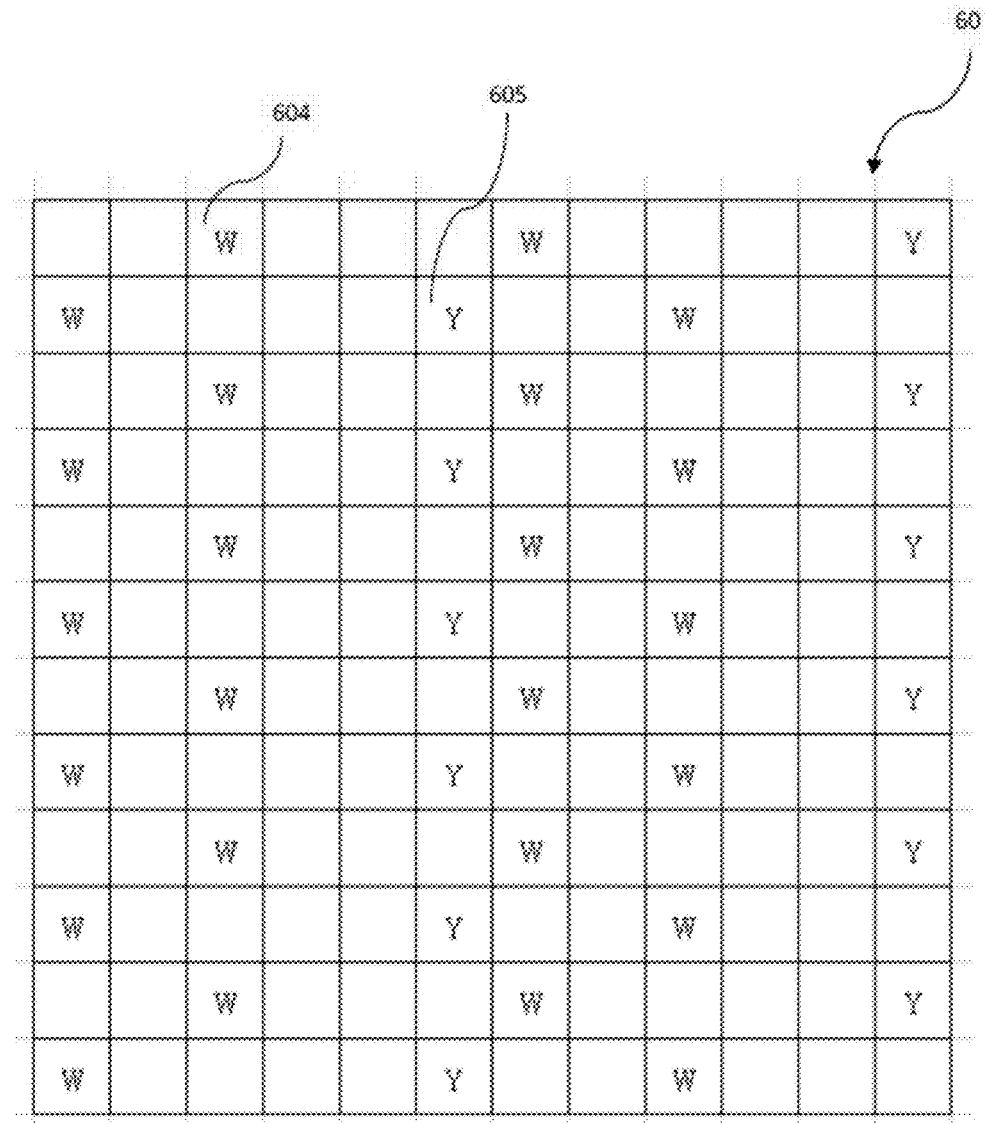
FIG. 34 illustrates an image device according to a fourth embodiment of the present disclosure.

FIG. 34 illustrates an image device according to a fourth embodiment of the present disclosure. The image device 60 comprises a plurality of pixels comprising a plurality of sub-pixels with different colors arranged in a matrix of rows and columns. As shown in FIG. 34, the image device 60 comprises a plurality of W sub-pixels 604 and a plurality of Y sub-pixels 605. The W sub-pixels 604 are arranged in the columns without Y sub-pixels 605, and the Y sub-pixels 605 are arranged in the columns without W sub-pixels 604. Each of the W sub-pixels 604 and each of the Y sub-pixels 605 are separately arranged in different columns. The W sub-pixels 604 in the same column are separately disposed. The Y sub-pixels 605 in the same column are separately disposed. Furthermore, the W sub-pixels 604 and the Y sub-pixels 605 arranged in any two adjacent columns are respectively arranged in different rows. The W sub-pixels 604 and the Y sub-pixels 605 arranged in any two separated columns are separated by two columns without W sub-pixels 604 or the Y sub-pixels 605. The W sub-pixels 604 arranged in any two nearby columns, which are separated by one column without W sub-pixels 604 or the Y sub-pixels 605, are respectively arranged in different rows.

Figure 35:
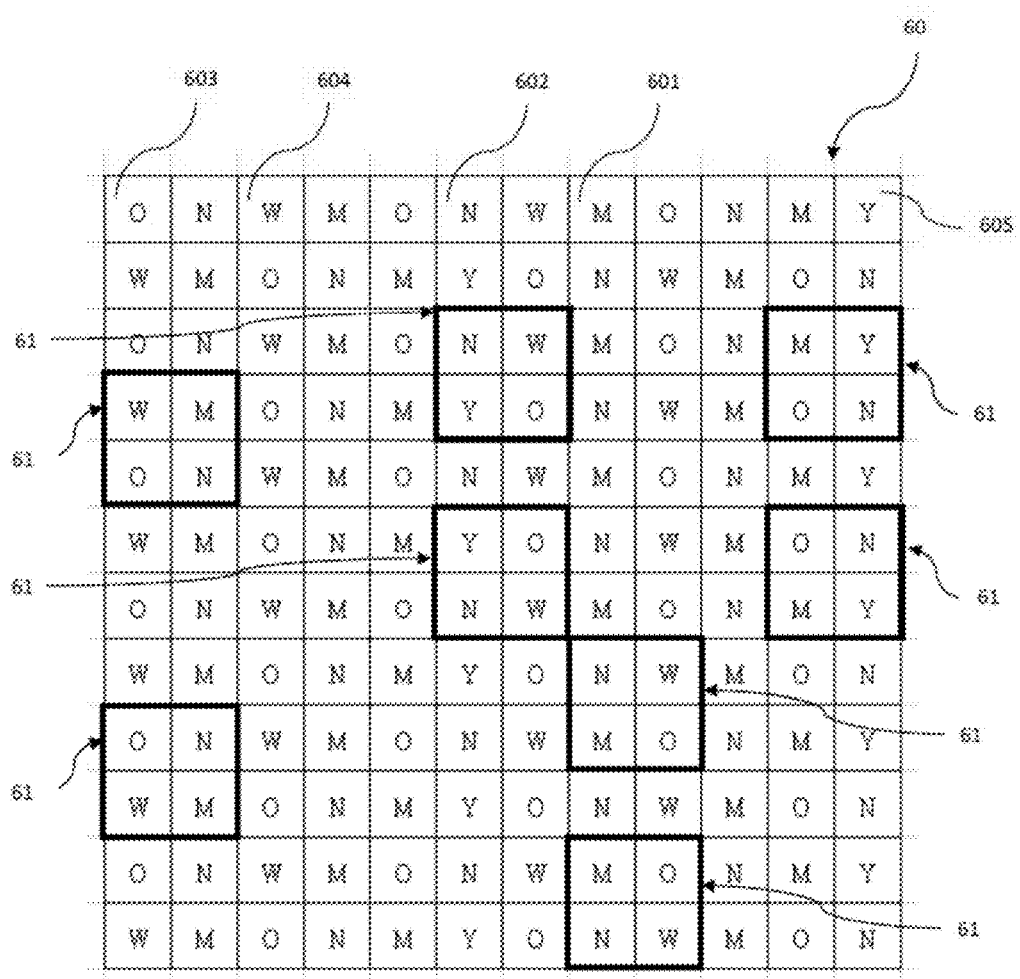
FIG. 35 illustrates an example of the image device of FIG. 34 according to the fourth embodiment of the present disclosure.
Figure 36:
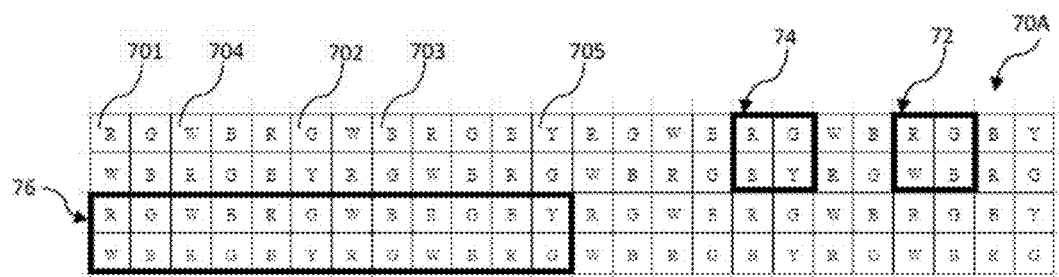
FIGS. 36-39 illustrate several modified examples of the image devices according to the fourth embodiment of the present disclosure.
Figure 37:
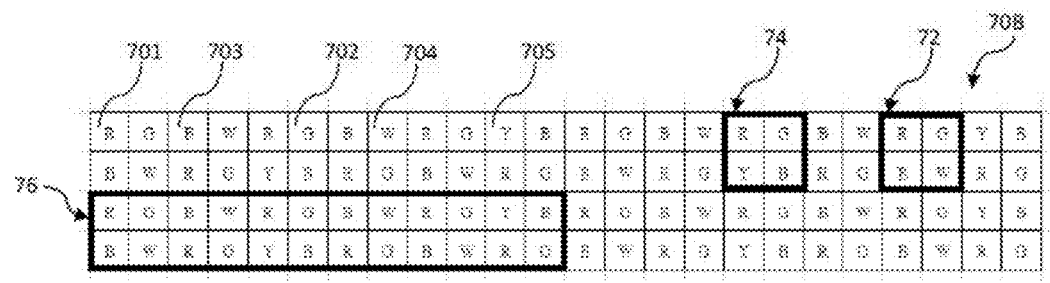
Figure 38:
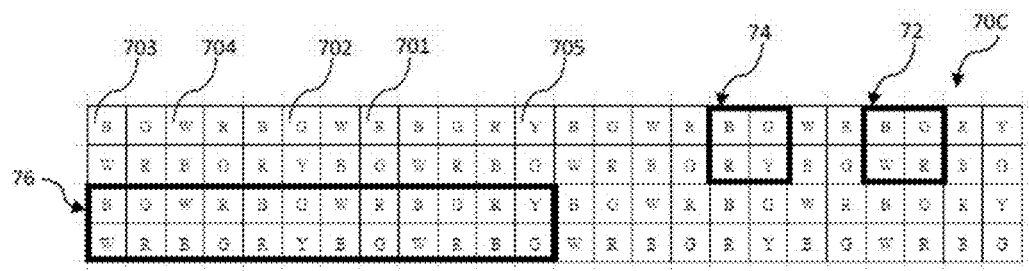
Figure 39:
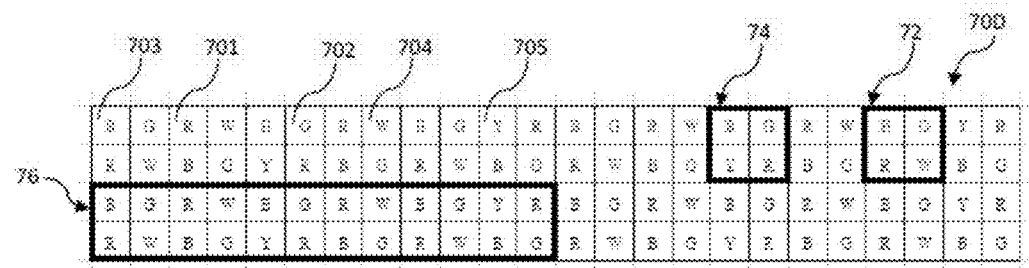

FIG. 35 illustrates an example of the image device 60 of FIG. 34 according to the fourth embodiment of the present disclosure. The image device 60 comprises a plurality of pixels comprising a plurality of sub-pixels with different colors arranged in a matrix of rows and columns. As shown in FIG. 35, the image device 60 comprises a plurality of M sub-pixels 601, a plurality of N sub-pixels 602, a plurality of O sub-pixels 603, a plurality of W sub-pixels 604 and a plurality of Y sub-pixels 605. In a 2×2 matrix 61, there are always one M sub-pixel 601, one N sub-pixel 602, and one O sub-pixel 603. In other words, the image device 60 may comprise a plurality of MNOW pixels and a plurality of MNOY pixels. Each MNOW pixel comprises a M sub-pixel 601, a N sub-pixel 602, an O sub-pixel 603 and a W sub-pixel 604. Each MNOY pixel comprises a M sub-pixel 601, a N sub-pixel 602, an O sub-pixel 603 and a Y sub-pixel 605. The MNOW pixels and the MNOY pixels are mixed in the image device 60.

The M sub-pixel 601, the N sub-pixel 602, and the O sub-pixel 603 may respectively be a R sub-pixel, a G sub-pixel, or a B sub-pixel, as required or designed. Namely, the M sub-pixel 601 may be a R sub-pixel, a G sub-pixel, or a B sub-pixel, the N sub-pixel 602 may be a R sub-pixel, a G sub-pixel, or a B sub-pixel, and the O sub-pixel 603 may be a R sub-pixel, a G sub-pixel, or a B sub-pixel.

Furthermore, in the image device 60, a ratio of the number of M sub-pixels 601 to the number of N sub-pixels 602 to the number of O sub-pixels 603 to the number of W sub-pixels 604 and to the number of Y sub-pixels 605 is m:n:o:w:y. The m is substantially equal to the n. The m is substantially equal to the o. The m is larger than w. The m is larger than y. Sum of the w and the y is substantially equal to the m.

FIGS. 36-39 illustrate several modified examples of image devices 70A-70D following the arrangement rule of the W sub-pixels and Y sub-pixel described above shown in FIG. 34 according to the fourth embodiment of the present disclosure. Each of the image devices 70A-70D comprises a plurality of pixels comprising a plurality of sub-pixels with different colors arranged in a matrix of rows and columns. More specifically, each of the image devices 70A-70D comprises a plurality of RGBW pixels 72 and a plurality of RGBY pixels 74. Each RGBW pixels 72 comprises a R sub-pixel 701, a G sub-pixel 702, a B sub-pixel 703 and a W sub-pixel 704. Each RGBY pixel 74 comprises a R sub-pixel 701, a G sub-pixel 702, a B sub-pixel 703 and a Y sub-pixel 705. The RGBW pixels 72 and the RGBY pixels 74 are mixed in each of the image devices 70A-70D.

As shown in FIGS. 36-39, each of the image devices 70A-70D comprises a plurality of W sub-pixels 704 and a plurality of Y sub-pixels 705. The W sub-pixels 704 are arranged in the columns without Y sub-pixels 705, and the Y sub-pixels 705 are arranged in the columns without W sub-pixels 704. The W sub-pixels 704 and the Y sub-pixels 705 are separately arranged in different columns. The W sub-pixels 704 in the same column are separately disposed. The Y sub-pixels 705 in the same column are separately disposed. Furthermore, the W sub-pixels 704 and the Y sub-pixels 705 arranged in any two adjacent columns are respectively arranged in different rows. The W sub-pixels 704 arranged in any two nearby columns, which are separated by one column without W sub-pixels 704 or the Y sub-pixels 705, are respectively arranged in different rows.

As shown in FIGS. a basic repeating unit 76 is defined. The basic repeating unit 76 is a 2×12 matrix with different color sub-pixels. Repeating the basic repeating unit 76 as much as required to form each of the image devices 70A-70D. In the basic repeating unit 76, a ratio of the number of R sub-pixels 701 to the number of G sub-pixels 702 to the number of B sub-pixels 703 to the number of W sub-pixels 704 and to the number of Y sub-pixels 705 is m:n:o:w:y. The m is substantially equal to the n. The m is substantially equal to the o. The m is larger than w. The m is larger than y. Sum of the w and the y is substantially equal to the m.

In this embodiment, a ratio of the number of R sub-pixels 701 to the number of G sub-pixels 702 to the number of B sub-pixels 703 to the number of W sub-pixels 704 and to the number of Y sub-pixels 705 is about 3:3:3:2:1. Furthermore, in the basic repeating unit 76, a ratio of the total area of R sub-pixels 701 to the total area of G sub-pixels 702 to the total area of B sub-pixels 703 to the total area of W sub-pixels 704 and to the total area of Y sub-pixels 705 is about 3:3:3:2:1.

Further, a designated white balance status can be maintained by adjusting the blue information of the image device. In case of liquid-crystal display LCD, for example the backlight color can be adjusted, and/or the thickness, area, and/or pigment of the blue sub-pixels in the color filter can be adjusted, and/or the utilization of quantum dots can be adjusted so as to adjust the blue information and to maintain a designated white balance status of the image device. In case of organic light-emitting diode OLED plus color filter, OLED color can be adjusted to bluish, and/or the thickness, area, and/or pigment of the blue sub-pixels in the color filter can be adjusted, and/or the utilization of quantum dots can be adjusted so as to adjust the blue information and to maintain a designated white balance status of the image device.

The present disclosure also provides methods to determine the ratio of the number of RGBW pixels to the number of RGBY pixels in an image device according to the invention. The method according to a first embodiment of the present disclosure comprises a step for determining the ratio by a function of a yellow sub-pixel information, a red sub-pixel information, a green sub-pixel information, a blue sub-pixel information and a white sub-pixel information of the image device. The sub-pixel information comprises the chrominance data and luminance data of the said sub-pixel. In an embodiment, the yellow sub-pixel information comprises the chrominance data and luminance data of the yellow sub-pixel, the red sub-pixel information comprises the chrominance data and luminance data of the red sub-pixel, the green sub-pixel information comprises the chrominance data and luminance data of the green sub-pixel, and the white sub-pixel information comprises the chrominance data and luminance data of the white sub-pixel.

The present disclosure further provides a method to determine the ratio of the number of RGBW pixels to the number of RGBY pixels in an image device according to the invention. The method according to a second embodiment of the present disclosure comprises a step for determining the ratio by a function of a yellow sub-pixel information and a white sub-pixel information of the image device. The sub-pixel information comprises the chrominance data and luminance data of the said sub-pixel. In an embodiment, the yellow sub-pixel information comprises the chrominance data and luminance data of the yellow sub-pixel, and the white sub-pixel information comprises the chrominance data and luminance data of the white sub-pixel.

By the addition of RGBY pixels, the problem of dark yellow in the conventional RGBW display can be solved and chrominance quality can be improved. The present invention thus can solve the dark yellow problem of conventional RGBW display. The bluish problem can also be solved by the addition of RGBY pixels.

The present disclosure also provides a method to determine the ratio of the number of RGBW pixels to the number of RGBY pixels in an image device. The method comprises a step for determining the ratio by a function of a yellow sub-pixel information, a red sub-pixel information, a green sub-pixel information, a blue sub-pixel information and a white sub-pixel information of the image device.

The present disclosure also provides a method to determine the ratio of the number of RGBW pixels to the number of RGBY pixels in an image device. The method comprises a step for determining the ratio by a function of a yellow sub-pixel information and a white sub-pixel information of the image device.

In another embodiment, the filter of the white sub-pixels can be made bluish so that the emitted light from the white sub-pixels is bluish rather than pure white. The bluish-white color sub-pixels compensate the yellow color of the additional yellow sub-pixels. As a result a designated white balance status of the image device can be maintained.

The embodiments shown and described above are only examples. Many details are often found in the art such as the other features of an image device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An image device comprising:
   a plurality of red sub-pixels;
   a plurality of green sub-pixels;
   a plurality of blue sub-pixels;
   a plurality of white sub-pixels; and
   a plurality of yellow sub-pixels;
   wherein a ratio of the total number of red sub-pixels to the total number of green sub-pixels to the total number of blue sub-pixels to the total number of white sub-pixels and to the total number of yellow sub-pixels is about 3:3:3:2:1; and
   wherein the red sub-pixels, the green sub-pixels, the blue sub-pixels, the white sub-pixels, and the yellow sub-pixels are arranged in a matrix of rows and columns; and
   in any two adjacent rows, the white sub-pixels and the yellow sub-pixels are arranged in the same row; and in this row, white sub-pixels and yellow sub-pixels are separately disposed, and two white sub-pixels are arranged between two yellow sub-pixels.

2. The image device of claim 1, wherein a ratio of the total area of red sub-pixels to the total area of green sub-pixels to the total area of blue sub-pixels to the total area of white sub-pixels and to the total area of yellow sub-pixels is about 3:3:3:2:1.

3. The image device of claim 1, wherein in any two adjacent columns having white sub-pixels, no yellow sub-pixel is arranged and the white sub-pixels are arranged in the same column; and in any two adjacent columns having yellow sub-pixels, no white sub-pixel is arranged and the yellow sub-pixels are arranged in the same column.

4. The image device of claim 3, wherein the white sub-pixels in the same column are separately disposed; and the yellow sub-pixels in the same column are separately disposed.

5. The image device of claim 4, wherein the white sub-pixels and the yellow sub-pixels arranged in any two nearby columns, which are separated by one column without white sub-pixels or yellow sub-pixels, are respectively arranged in different rows.

6. The image device of claim 5, wherein the white sub-pixels arranged in any two nearby columns, which are separated by one column without white sub-pixels or yellow sub-pixels, are respectively arranged in different rows.

7. The image device of claim 1, wherein the white sub-pixels are arranged in the columns without yellow sub-pixels, and the yellow sub-pixels are arranged in the columns without white sub-pixels.

8. The image device of claim 7, wherein the white sub-pixels in the same column are separately disposed; and the yellow sub-pixels in the same column are separately disposed.

9. The image device of claim 8, wherein the white sub-pixels and the yellow sub-pixels arranged in any two adjacent columns are respectively arranged in different rows.

10. The image device of claim 9, wherein the white sub-pixels and the yellow sub-pixels arranged in any two separated columns are separated by two columns without white sub-pixels or yellow sub-pixels.

11. The image device of claim 10, wherein the white sub-pixels arranged in any two nearby columns, which are separated by one column without white sub-pixels or yellow sub-pixels, are respectively arranged in different rows.

12. The image device of claim 1, wherein the white sub-pixels are arranged in the columns without yellow sub-pixels, and the yellow sub-pixels are arranged in the columns without white sub-pixels.

13. The image device of claim 12, wherein the white sub-pixels and the yellow sub-pixels arranged in any two adjacent columns are respectively arranged in different rows; and the white sub-pixels arranged in any two adjacent columns are respectively arranged in different rows.

14. The image device of claim 1, wherein in any two adjacent columns, all of the white sub-pixels and the yellow sub-pixels are arranged in the same column; and in the column, white sub-pixels and yellow sub-pixels are separately disposed, and two white sub-pixels are arranged between two yellow sub-pixels.

15. The image device of claim 14, wherein the white sub-pixels are arranged in the rows without yellow sub-pixels, and the yellow sub-pixels are arranged in the rows without white sub-pixels.

16. The image device of claim 15, wherein the white sub-pixels and the yellow sub-pixels arranged in any two adjacent rows are respectively arranged in different columns.

17. The image device of claim 1, wherein all the sub-pixels form a plurality of RGBW pixels and a plurality of RGBY pixels, each of the RGBW pixel comprising one red sub-pixel, one green sub-pixel, one blue sub-pixel, and one white sub-pixel; each of the RGBY pixel comprising one red sub-pixel, one green sub-pixel, one blue sub-pixel, and one yellow sub-pixel.

* * * * *